United States Patent
Waheed et al.

(10) Patent No.: US 7,675,368 B2
(45) Date of Patent: *Mar. 9, 2010

(54) HYBRID STOCHASTIC GRADIENT BASED DIGITALLY CONTROLLED OSCILLATOR GAIN $K_{DCO}$ ESTIMATION

(75) Inventors: Khurram Waheed, Acton, MA (US); Robert B. Staszewski, Delft (NL)

(73) Assignee: Texas Instruments Incorporated, Dallas, TX (US)

( * ) Notice: Subject to any disclaimer, the term of this patent is extended or adjusted under 35 U.S.C. 154(b) by 28 days.

This patent is subject to a terminal disclaimer.

(21) Appl. No.: 12/111,813

(22) Filed: Apr. 29, 2008

(65) Prior Publication Data
US 2008/0218282 A1    Sep. 11, 2008

Related U.S. Application Data

(63) Continuation of application No. 11/460,221, filed on Jul. 26, 2006, now Pat. No. 7,365,609.

(51) Int. Cl.
*H03C 3/06* (2006.01)
*H03L 7/099* (2006.01)
*G06F 17/50* (2006.01)

(52) U.S. Cl. .................. 331/17; 332/127; 375/376; 455/260; 703/15

(58) Field of Classification Search ............ 331/16–18, 331/25, 175; 327/156–159; 332/127; 360/51; 375/376; 455/260; 703/13–15
See application file for complete search history.

(56) References Cited

U.S. PATENT DOCUMENTS 5,467,370 A * 11/1995 Yamasaki et al. ............ 375/232
6,263,032 B1    7/2001 Fredrickson et al.

OTHER PUBLICATIONS

"A Simplified Continuous Phase Modulator Technique", Thomas A.D. Riley, et al., IEEE Transactions on Circuits and Systems-II: Analog and Digital Signal Processing, vol. 41, No. 5, May 1994, pp. 321-328.

"A 27-mW CMOS Fractional-N Synthesizer Using Digital Compensation for 2.5-Mb/s GFSK Modulation", IEEE Journal of Solid-State Circuits, vol. 32, No. 12, Dec. 1997, pp. 2048-2060.

(Continued)

*Primary Examiner*—David Mis
(74) *Attorney, Agent, or Firm*—Ronald O. Neerings; Wade James Brady, III; Frederick J. Telecky, Jr.

(57) ABSTRACT

A novel hybrid stochastic gradient adaptation apparatus and method for calibrating the gain of an RF or non-RF digitally controlled oscillator (DCO). The adaptation algorithm determines a true stochastic gradient between a forcing function and its corresponding system measure to estimate the system parameters being adapted. A momentum term is generated and injected into the adaptation algorithm in order to stabilize the algorithm by adding inertia against any large transient variations in the input data. In the case of adaptation of DCO gain $K_{DCO}$, the algorithm determines the stochastic gradient between time varying calibration or actual modulation data and the raw phase error accumulated in an all digital phase locked loop (ADPLL). Two filters preprocess the observable data to limit the bandwidth of the computed stochastic gradient providing a trade-off between sensitivity and settling time.

20 Claims, 15 Drawing Sheets

OTHER PUBLICATIONS

"A 2.5-Mb/s GFSK 5.0-Mb/s 4-FSK Automatically Calibrated Frequency Synthesizer", Daniel R. McMahill, et al., IEEE Journal of Solid-State Circuits, vol. 37, No. 1, Jan. 2002, pp. 18-26.

"A Quad-Band GSM-GPRS Transmitter with Digital Auto-Calibration", See Taur Lee, et al.., IEEE Journal of Solid-State Circuits, vol. 39, No. 12, Dec. 2004, pp. 2200-2214.

"A DECT Transceiver Chip Set Using SiGe Technology", Matthias Bopp, et al., Proc. of IEEE Solid-State Circuits Conference, Feb. 1999, pp. 68, 69,447.

"Just In Time Gain Estimation of an RF Digitally-Controlled Oscillator for Digital Direct Frequency Modulation", Robert Staszewski, et al., IEEE Transactions on Circuits and Systems II: Analog and Digital Signal Processing, vol. 50, No. 11, Nov. 2003, pp. 887-892.

\* cited by examiner

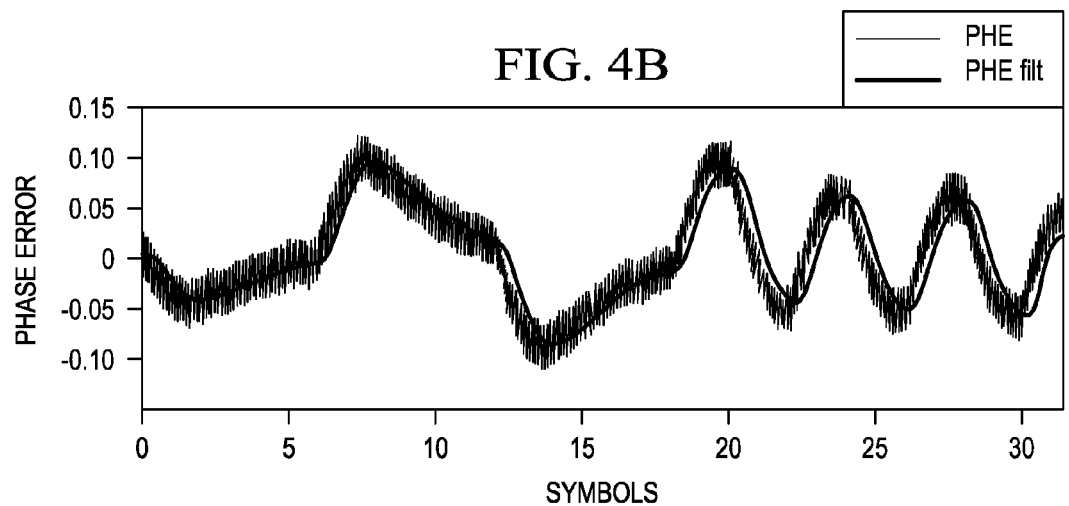
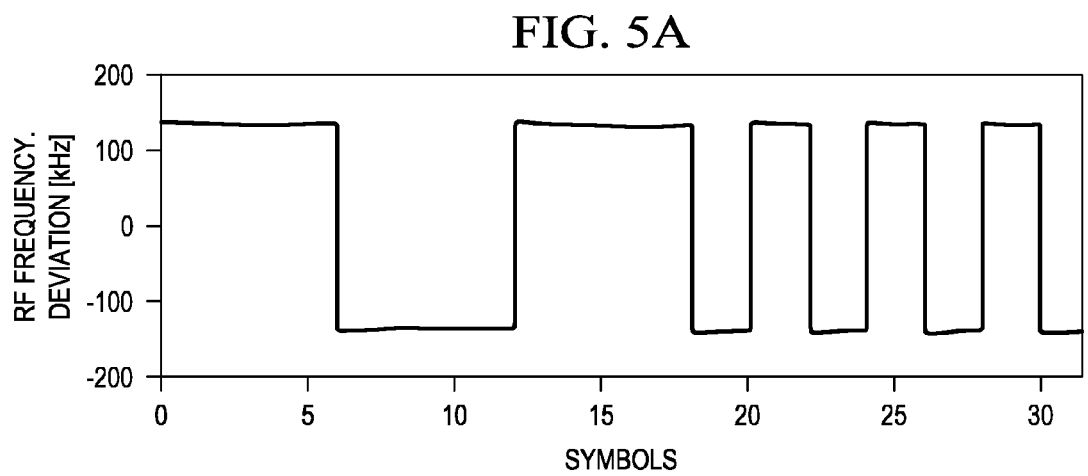
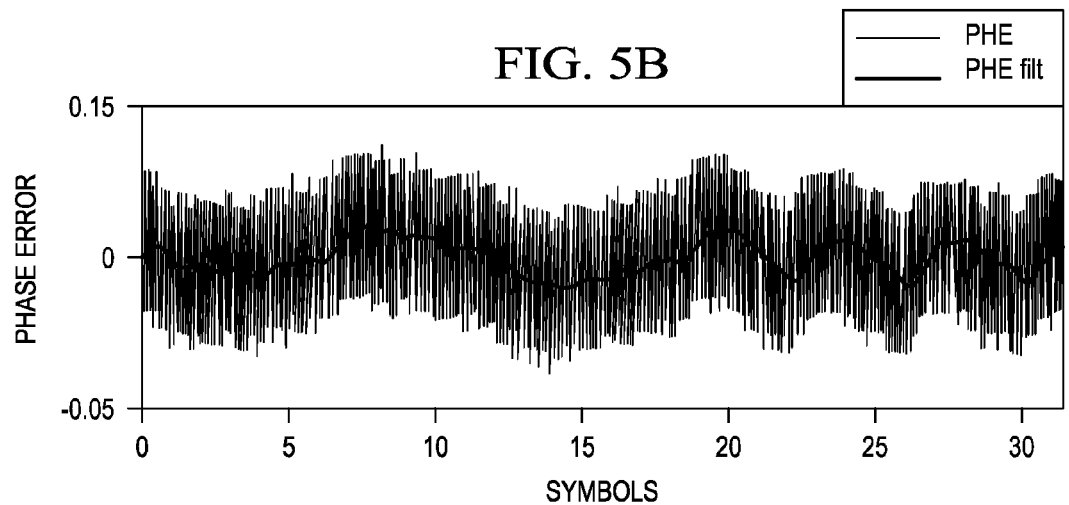

HYBRID STOCHASTIC GRADIENT BASED DIGITALLY CONTROLLED OSCILLATOR GAIN $K_{DCO}$ ESTIMATION

This application is a Continuation of application Ser. No. 11/460,221 filed Jul. 26, 2006 now U.S. Pat. No. 7,365,609.

FIELD OF THE INVENTION

The present invention relates to the field of data communications and more particularly relates to an apparatus for and the method of a hybrid stochastic gradient based gain calibration technique for a radio frequency (RF) digitally controlled oscillator (DCO) in an all digital phase locked loop (ADPLL).

BACKGROUND OF THE INVENTION

Oscillators are a key component in the design of radio frequency (RF) communication systems. The estimation and calibration of the modulation gain of an RF oscillator is currently an area of active research. Accurate knowledge of this gain significantly reduces the complexity and increases the performance of the transmit frequency modulation path. It is particularly beneficial in systems implemented in deep submicron CMOS and based on orthogonal frequency/phase and amplitude (i.e. polar) topology. Estimation of RF oscillator frequency-modulation gain is especially important in low-cost high-volume transceivers. In such systems, the phase locked loop sets the loop bandwidth while the transmitter sets the transfer function of the direct frequency modulation path wherein the acceptable gain estimation error ranges from less than 1% for CDMA to several percents for GSM and Bluetooth, for example.

The value of the frequency gain ($K_{DCO}$) of an RF oscillator, such as a digitally controlled oscillator (DCO), at any point in time is a function of frequency as well as the current state of process, voltage and temperature (PVT). For a two point direct modulation scheme such as used in DRP based radios, the modulation accuracy depends on accurate estimation and calibration of the DCO gain.

Most modulation schemes based on a polar topology or direct frequency modulation in use today demand fairly strict accuracy on the DCO gain estimate. For example, for modern modulation schemes such as EDGE, WCDMA, WLAN and WiMax, the performance requirements of the transmitter demand better than 1% accuracy on the estimation of the DCO gain at all times. This is to enable these modulation schemes to achieve a better than 0.1 ppm frequency error specification.

A well-known method for achieving indirect frequency/phase modulation is the use of sigma-delta modulation of the feedback division ratio in a fractional-N PLL frequency synthesizer, described in T. Riley et al., "A simplified continuous time modulation technique," IEEE Trans. on Circuits and Systems II, Vol. 41. no. 5, pp. 321-328, May 1994.

To compensate high-frequency attenuation in a PLL with limited bandwidth, a prior art technique to boost high-frequency components in the digital modulating signal is described in M. H. Perrott et al. "A 27-mW CMOS fractional-N synthesizer using digital compensation for 2.5 Mb/s GFSK modulation," IEEE J. Solid-State Circuits, vol. 32, no. 12, pp. 2048-2060, December 1997. Unfortunately, the PLL frequency response is subject to process, voltage and temperature (PVT) variations of the charge pump, loop filter and voltage controlled oscillator (VCO).

To match the precompensation filter to the inverse frequency response of the PLL, a prior art automatic online calibration technique is described in D. R. McMahill et al., "A 2.5 Mb/s GFSK 5.0 Mb/s 4-FSK automatically calibrated Σ-Δ frequency synthesizer," IEEE J. Solid-State Circuits, vol. 37, no. 1, pp. 18-26, Jan. 2002. This technique is adapted to measure the phase error between the demodulated RF output and the reference input and adjust the PLL loop gain via the charge pump current. A major disadvantage of this technique is that it is analog in nature and would require costly additional analog circuitry to implement in an all digital design. Another disadvantage of this technique, however, is the cost of additional circuitry amounting to approximately ⅓ of the PLL, including a reference error filter, DPLL, vector test and RF phase quantizer. Further, this technique suffers from a slow time constant of 200 ms.

Another prior art calibration technique that measures the PLL loop magnitude response to a training tone whose frequency is located slightly beyond the loop bandwidth is described in S. T. Lee et al. "A quad-band GSM-GPRS transmitter with digital auto-calibration," IEEE J. Solid State Circuits, vol. 39, no. 12, pp. 2200-2214, December 2004. Several disadvantages of this scheme are that it uses dedicated input tone signals and departs from conventional PLL operation; has limited performance; and is not particularly suited for modern non-packetized modulation schemes.

A two-point direct modulation scheme is described in M. Bopp et al., "A DECT transceiver chip set using SiGe technology," Proc. of IEEE Solid-State Circuits Conf., pp. 68-69, 447, February 1999. This modulation scheme directly controls the oscillator frequency while compensating for the resulting loop reaction. A disadvantage of this approach, however, is that it is mostly analog in nature and requires precise calibration of the oscillator and other PLL analog components.

A fully-digital approach is described in R. B. Staszewski et al., "Just-in-time gain estimation of an RF digitally-controlled oscillator for digital direct frequency modulation," IEEE Trans. on Circuits and Systems II, vol. 50, no. 11, pp. 887-892, November 2003. This fully digital technique only requires calibration of the oscillator. Disadvantages of this technique, however, include its longer calibration time, dc-type algorithm, unsuitability for non-packetized operation, inability to achieve desired accuracy requirements and inability to handle DCO drift.

The prior art techniques discussed hereinabove suffer from disadvantages such as they (1) require a dedicated time for background calibration, which makes them suitable only for packetized operations, such as GSM/EDGE, but not WCDMA, (2) require dedicated and expensive analog hardware, (3) are dc based and are thus sensitive to frequency drift of the oscillator, (4) require factory calibration; (5) is unsuitable for non-packetized data; or (6) cannot meet performance requirements.

There is thus a need for a gain calibration technique that consumes little additional hardware, is very accurate, can continuously track changes in the gain with temperature and/or supply voltage and can adapt using either a training sequence or user/modulation data. Further it is desirable that the gain calibration technique be suitable for use with modern modulation schemes such as UMTS, EDGE, GSM, WCDMA, Bluetooth, etc. In the case of non-constant envelope signaling, the gain calibration technique should be applicable to the frequency/phase portion of a polar modulation transmitter.

SUMMARY OF THE INVENTION

The present invention is a novel hybrid stochastic gradient algorithm which is a general adaptation algorithm that can be applied to meet various calibration requirements that may exist in a variety of systems. The algorithm is particularly well suited to accurately perform DCO gain $K_{DCO}$ estimation and tracking in a digital radio processor (DRP) architecture during both initial calibration as well as modulation modes of operation. The invention provides the capability to perform precise estimation of $K_{DCO}$ thus meeting the modulation performance requirements of transceivers implementing modern modulation schemes such as GSM, EDGE, WCDMA, WLAN, WiMax and 3G UMTS. The term hybrid stems from the injection of a momentum term in the stochastic gradient algorithm implemented with gradient direction control.

The algorithm can be applied generally or in the case of apparatus for and a method of estimating, calibrating and tracking in real-time the gain of a radio frequency (RF) digitally controlled oscillator (DCO) in an all-digital phase locked loop (ADPLL). The precise setting of the inverse DCO gain in the ADPLL modulating path allows direct wideband frequency modulation that is independent of the ADPLL loop bandwidth.

The gain calibration technique is based on an iterative hybrid stochastic gradient algorithm wherein the ADPLL phase error is sampled and correlated with the modulating data to generate a gradient. A momentum term is optionally added to provide inertia against large transients in the input data and provide tighter convergence. This process, repeated over time, results in an improved estimate of the true DCO gain that ensures optimum performance and allows continuous operation in the presence of possible sources of variability, such as temporal temperature changes during operation.

The invention is applicable to any system in which it is desirable to estimate, calibrate and track the gain of a digitally controlled RF oscillator such as in mobile phones and other wireless applications. The invention is intended for use in a digital radio transmitter or transceiver but can be used in other applications as well, such as a general communication channel. The present invention provides a solution to the problems and disadvantages of prior art gain calibration techniques.

Unlike static (i.e. DC based) $K_{DCO}$ adaptation algorithms of the prior art, the gradient algorithm of the present invention is robust against slow center frequency drifts in the DCO due to LDO settling and variations in PVT. The hybrid stochastic gradient based $K_{DCO}$ adaptation algorithm of the present invention is modulation data based and is capable of tracking variations in $K_{DCO}$ due to temperature and other operational effects during modulation (i.e. PVT), especially in full duplex continuous transmission standards such as UMTS-FDD (WDCMA), etc.

The algorithm is operative to compute a true gradient and uses all observable samples for its updates. This results in faster and more robust convergence. For non-packetized systems, the algorithm continuously tracks the operational temperature profile while performing normal modulation.

The algorithm supports two modes of operation: an initial calibration and a background calibration. In the initial calibration mode, a predefined calibration sequence (e.g., square wave) is applied as the modulation to quickly determine the true DCO gain of the oscillator given the center frequency and temperature. In the background calibration mode, the algorithm tracks any changes in the DCO gain due to temperature, voltage and other operational conditions using the regular modulation data.

Several advantages of the DCO gain adaptation algorithm of the present invention include (1) fast and efficient implementation; (2) low cost and complexity; (3) unlike the prior art, it does not rely on zero crossings of the phase error (which is modulation dependent); (4) exhibits robust performance for most modern modulation schemes; and (5) suitable for initial and continuous background calibration using any modulation data (not just training data).

Note that the invention apparatus and the algorithm described functionally herein is a general adaptation algorithm which can be used for calibration and compensation of other tunable parameters in a PLL such as the RF system and/or any other systems as long as the observable excitation and consequence parameters can be identified.

Note that many aspects of the invention described herein may be constructed as software objects that are executed in embedded devices as firmware, software objects that are executed as part of a software application on either an embedded or non-embedded computer system running a real-time operating system such as WinCE. Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a hybrid stochastic gradient adaptation method, the method comprising the steps of first filtering an excitation signal to yield a filtered excitation signal therefrom, second filtering a consequence signal to yield a filtered consequence signal therefrom, calculating a stochastic gradient as a function of the filtered excitation signal and the filtered consequence signal, generating a momentum feedback signal from the stochastic gradient values and adding the momentum feedback signal to the stochastic gradient output to yield a new output parameter therefrom and adding the new output parameter value to a current output parameter value to generate an updated output parameter therefrom.

There is also provided in accordance with the invention, a method of gain calibration of a digitally controlled oscillator (DCO), the method comprising the steps of first filtering an input data frequency command word (FCW) to yield a filtered FCW therefrom, second filtering a phase error signal to yield a filtered phase error signal therefrom, calculating a stochastic gradient as a function of the filtered FCW and the filtered phase error signal and adding the stochastic gradient output to a current value of DCO gain multiplier to generate an updated DCO gain multiplier therefrom.

There is further provided in accordance with the invention, an apparatus for gain calibration of a digitally controlled oscillator (DCO) comprising a first filter for filtering an input data frequency command word (FCW) to yield a filtered FCW therefrom, a second filter for filtering a phase error signal to yield a filtered phase error signal therefrom, gradient means for calculating a stochastic gradient as a function of the filtered FCW and the filtered phase error signal, a momentum filter operative to generate a momentum feedback signal in response to the stochastic gradient values and to add the momentum feedback signal to the stochastic gradient output to yield a modified stochastic gradient therefrom and an accumulator operative to add the modified stochastic gradient to a current value of a DCO gain multiplier value to yield an updated DCO gain multiplier therefrom.

There is also provided in accordance with the invention, an apparatus for generating a digitally controlled oscillator (DCO) gain multiplier comprising means for filtering an input data frequency command word (FCW) to yield a filtered FCW therefrom, means for filtering a phase error signal to yield a filtered phase error signal therefrom, means for calculating a stochastic gradient as a function of the filtered FCW and the filtered phase error signal, means for generating a momentum feedback signal in response to the stochastic gradient values and adding the momentum feedback signal to the stochastic gradient output to yield a modified stochastic gradient therefrom and means for adding the modified stochastic gradient to a current value of a DCO gain multiplier value to yield an updated DCO gain multiplier therefrom.

There is further provided in accordance with the invention, a transmitter comprising a frequency synthesizer for performing, a frequency modulation; the frequency synthesizer comprising a digitally controlled oscillator (DCO), a gain calibration circuit of the digitally controlled oscillator, the gain calibration circuit comprising means for filtering an input data frequency command word (FCW) to yield a filtered FCW therefrom, means for filtering a phase error signal to yield a filtered phase error signal therefrom, means for calculating a stochastic gradient as a function of the filtered FCW and the filtered phase error signal, means for generating a momentum feedback signal in response to the stochastic gradient values and adding the momentum feedback signal to the stochastic gradient output to yield a modified stochastic gradient therefrom and means for adding the modified stochastic gradient to a current value of a DCO gain multiplier value to yield an updated DCO gain multiplier therefrom.

BRIEF DESCRIPTION OF THE DRAWINGS

The invention is herein described, by way of example only, with reference to the accompanying drawings within:

FIG. 4B is a graph of the non-filtered and filtered phase error in the presence of +10% $K_{DCO}$ error;

FIG. 5A is a graph of frequency deviation versus number of symbols;

FIG. 5B is a graph of the non-filtered and filtered phase error in the presence of +1% $K_{DCO}$ error;

DETAILED DESCRIPTION OF THE INVENTION

Notation Used Throughout

Figure 1:
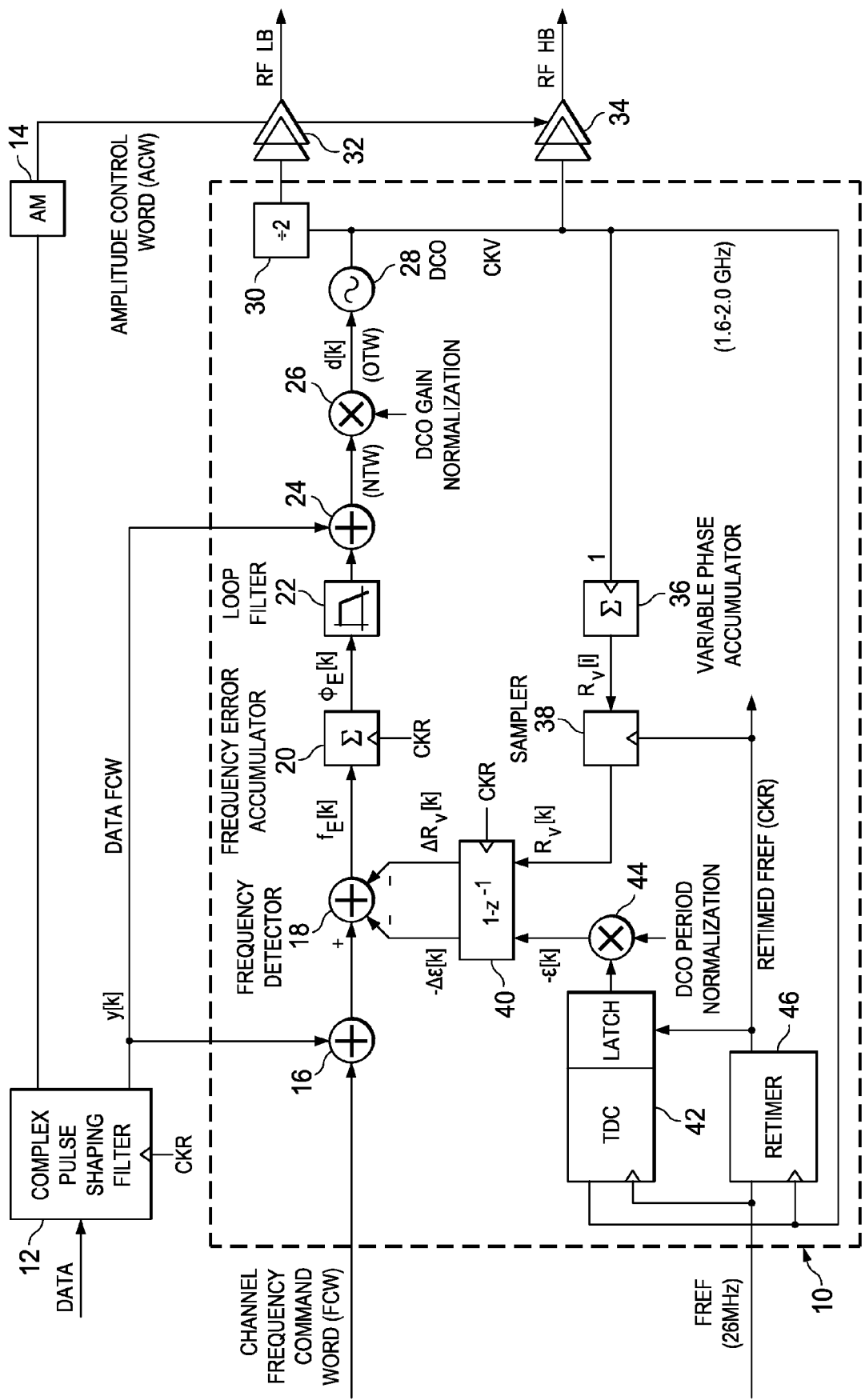
FIG. 1 is a simplified block diagram illustrating, an all digital phase locked loop (ADPLL) based polar transmitter constructed in accordance with the present invention.

The following notation is used throughout this document.

| Term | Definition |
| --- | --- |
| ADPLL | All Digital Phase Locked Loop |
| ASIC | Application Specific Integrated Circuit |
| CDMA | Code Division Multiple Access |
| CKR | Retimed Reference Clock |
| CKV | Variable Oscillator Clock |
| CMOS | Complementary Metal Oxide Semiconductor |
| DCO | Digitally Controlled Oscillator |
| DECT | Digital Enhanced Cordless Telecommunications |
| DPLL | Digital Phase Locked Loop |
| DRP | Digital RF Processor or Digital Radio Processor |
| EDGE | Enhanced Data rates for GSM Evolution |
| EDR | Enhanced Data Rate |
| FCW | Frequency Command Word |
| FDD | Frequency Division Duplex |
| FPGA | Field Programmable Gate Array |
| FREF | Frequency Reference |
| FSK | Frequency Shift keying |
| GFSK | Gaussian Frequency Shift Keying |
| GPRS | General Packet Radio Service |
| GSM | Global System for Mobile communications |
| HB | High Band |
| HDL | Hardware Description Language |
| IEEE | Institute of Electrical and Electronic Engineers |
| IIR | Infinite Impulse Response |
| LB | Low Band |
| LDO | Low Drop-Out regulator |
| MOSCAP | Metal Oxide Semiconductor Capacitor |
| PHE | Phase Error |
| PLL | Phase Locked Loop |
| PVT | Process, Voltage, Temperature |
| RF | Radio Frequency |
| TDC | Time to Digital Converter |
| UMTS | Universal Mobile Telecommunications System |
| VCO | Voltage Controlled Oscillator |
| WCDMA | Wideband Code Division Multiple Access |
| WiMAX | Worldwide Interoperability for Microwave Access |
| WLAN | Wireless Local Area Network |

DETAILED DESCRIPTION OF THE INVENTION

The present invention is a hybrid stochastic gradient adaptation apparatus and a method for calibrating the gain of an RF or non-RF digitally controlled oscillator (DCO). The term hybrid stems from the injection of a momentum term in the stochastic gradient algorithm implemented with gradient direction control. The invention is applicable to any system in which it is desirable to estimate, calibrate and track the gain of an RF digitally controlled oscillator such as in mobile phones and other wireless applications. The invention is intended for use in a digital radio transmitter or transceiver but can be used in other applications as well, such as a general communication channel. The present invention provides a solution to the problems and disadvantages of prior art oscillator gain calibration techniques.

To aid in understanding the principles of the present invention, a description is provided in the context of a digital RF processor (DRP) transmitter and receiver that may be adapted to comply with a particular wireless communications standard such as GSM, Bluetooth, WCDMA, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulation. The invention is applicable to any system in which it is desirable to estimate, calibrate and track the modulation gain of a digitally controlled oscillator.

Note that throughout this document, the tens communications device is defined as any apparatus or mechanism adapted to transmit, or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. The notation DRP is intended to denote either a Digital RF Processor or Digital Radio Processor. References to a Digital RF Processor infer a reference to a Digital Radio Processor and vice versa.

A block diagram illustrating an all digital phase locked loop (ADPLL) based polar transmitter constructed in accordance with the present invention is shown in FIG. 1. For illustration purposes only, the transmitter, as shown, is adapted for the GSM/EDGE cellular standard. It is appreciated, however, that one skilled in the communication arts can adapt the transmitter illustrated herein to other modulations and communication standards as well without departing from the spirit and scope of the present invention. For example, the transmitter illustrated in FIG. 1 can be extended for performing, an arbitrary quadrature modulation scheme.

A description of the ADPLL, generally referenced 10, including the frequency/phase modulation path is provided hereinbelow. The core of the ADPLL is a digitally controlled oscillator (DCO) 28 adapted to generate the RF oscillator clock CKV. The oscillator core (not shown) operates at twice the 1.6-2.0 GHz high frequency band or four times the 0.8-1.0 GHz low frequency band. The output of the DCO is then divided for precise generation of RX quadrature signals, and for use as the transmitter's carrier frequency. The single DCO is shared between transmitter and receiver and is used for both the high frequency bands (HB) and the low frequency bands (LB). An additional 4-bits of the tracking bank are dedicated for $\Sigma\Delta$ dithering in order to improve frequency resolution, as described in more detail infra. The DCO varactors may be realized as n-poly/n-well MOS capacitor (MOSCAP) devices that operate in the flat regions of their C-V curves. The finest step size (i.e. DCO gain) is about 12 kHz/LSB in 90 nm CMOS process which is subject to changes in PVT. The output of the DCO is input to the RF high band power amplifier 34. It is also input to the RF low band power amplifier 32 after divide by 2 in divider 30.

The expected variable frequency $f_V$ is related to the reference frequency $f_R$ by the frequency command word (FCW).

$$FCW[k] \equiv \frac{E(f_V[k])}{f_R} \qquad (1)$$

The FCW is time variant and is allowed to change with every cycle $T_R=1/f_R$ of the frequency reference clock. With $W_F=24$ the word length of the fractional part of FCW, the ADPLL provides fine frequency control with 1.5 Hz accuracy, according to:

$$\Delta f_{res} = \frac{f_R}{2^{W_F}} \qquad (2)$$

The number of integer bits $W_I=8$ was chosen to fully cover the GSM band frequency range of $f_V=1,600$-$2,000$ MHz with an arbitrary reference frequency $f_R \geq 8$ MHz.

The ADPLL operates in a digitally-synchronous fixed-point phase domain as follows: The variable phase accumulator 36 determines the variable phase $R_V[i]$ by counting the number of rising clock transitions of the DCO oscillator clock CKV as expressed below.

$$R_V[i] = \sum_{l=0}^{i} 1 \qquad (3)$$

The index i indicates the DCO edge activity. The variable phase $R_V[i]$ is sampled via sampler 38 to yield sampled FREF variable phase $R_V[k]$, where k is the index of the FREF edge activity. The sampled FREF variable phase $R_V[k]$ is fixed-point concatenated with the normalized time-to-digital converter (TDC) 42 output $\epsilon[k]$. The TDC measures and quantizes the time differences between the frequency reference FREF and the DCO clock edges. The sampled differentiated (via block 40) variable phase is subtracted from the frequency command word (FCW) by the digital frequency detector 18. The frequency error $f_E[k]$ samples $$f_E[k]=FCW-[(R_V[k]-\epsilon[k])-(R_V[k-1]-\epsilon[k-1])] \qquad (4)$$

are accumulated via the frequency error accumulator 20 to create the phase error $\phi_E[k]$ samples $$\phi_E[k] = \sum_{l=0}^{k} f_E[k]. \qquad (5)$$

which are then filtered by a fourth order IIR filter 22 and scaled by a proportional loop attenuator $\alpha$. A parallel feed with coefficient $\rho$ adds an integrated term to create type-II loop characteristics which suppresses the DCO flicker noise.

The IIR filter is a cascade of four single stage filters, each satisfying the following equation:

$$y[k]=(1-\lambda)\cdot y[k-1]+\lambda x[k] \qquad (6)$$

wherein
x[k] is the current input;
y[k] is the current output:
k is the time index;
$\lambda$ is the configurable coefficient;

The 4-pole IIR filter attenuates the reference and TDC quantization noise with an 80 dB/dec slope, primarily to meet the GSM, spectral mask requirements at 400 kHz offset. The filtered and scaled phase error samples are then multiplied by the DCO gain $K_{DCO}$ normalization factor $f_R/\hat{K}_{DCO}$ via multiplier 26, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 16 and 24. A hitless gear-shifting mechanism for the dynamic loop bandwidth control serves to reduce the settling time. It changes the loop attenuator $\alpha$ several times during the frequency locking while adding the $(\alpha_1/\alpha_2-1)\phi_1$ dc offset to the phase error, where indices 1 and 2 denote before and after the event, respectively. Note that $\alpha_1=\alpha_2$, since the phase is to be continuous.

The FREF input is resampled by the RF oscillator clock CKV via retimer block 46 which may comprise a flip flop or register clocked by the reference frequency FREF. The resulting retimed clock (CKR) is distributed and used throughout the system. This ensures that the massive digital logic is clocked after the quiet interval of the phase error detection by the TDC.

In the example embodiments described herein, the ADPLL is a discrete-time sampled system implemented with all digital components connected with all digital signals. Consequently, the z-domain representation is a natural fit and is also accurate with no necessity for approximations that would result, for example, in an impulse response transformation due to the use of analog loop filter components.

Figure 2:
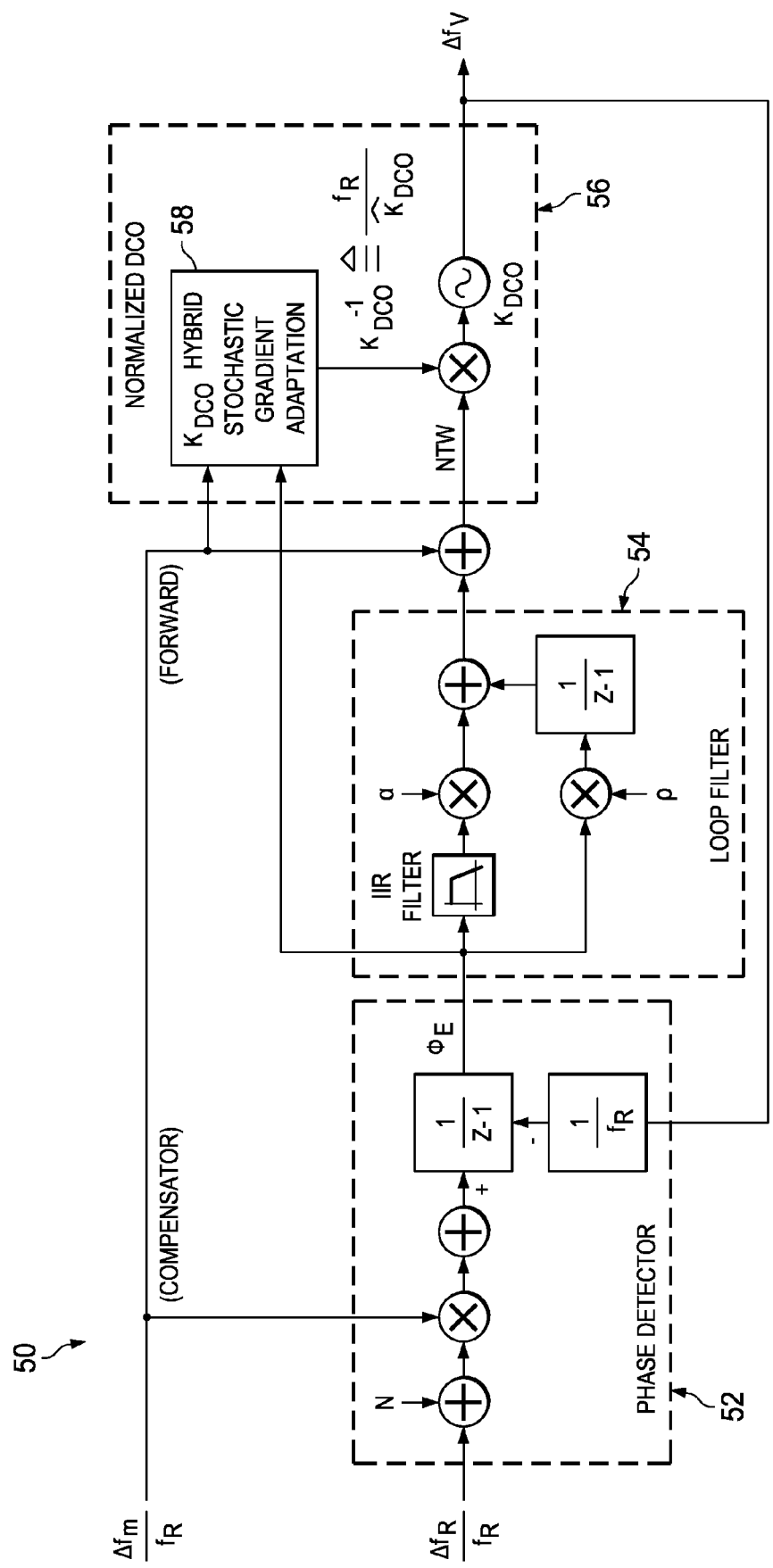
FIG. 2 is a simplified block diagram illustrating a z-domain model of the ADPLL with wideband frequency modulation and incorporating the hybrid stochastic gradient adaptation scheme of the present invention.

A block diagram illustrating a z-domain model of the ADPLL wideband frequency modulation path incorporating the hybrid stochastic gradient gain calibration adaptation mechanism of the present invention is shown in FIG. 2. The model, generally referenced 50, comprises a phase detector portion 52, loop filter portion 54 and normalized DCO portion 56 incorporating $K_{DCO}$ gain adaptation block 58. In operation, the gain adaptation algorithm takes the modulation data input (i.e. FCW) and the raw unfiltered phase error as inputs and generates the DCO gain multiplier $f_R/\hat{K}_{DCO}$ which is used to scale the tuning word before input to the DCO. $\hat{K}_{DCO}$ being an estimate of the DCO gain.

The fixed-point modulating data $\Delta f_m/f_R$ ($y[k] \equiv \Delta f_m/f_R$ in FIG. 1) directly affects the oscillating frequency $f_V$ through the feedforward path. The phase locked loop will try to correct this perceived frequency perturbation integrated over the update period of $1/f_R$. This corrective action is compensated by the other compensating feed. The loop response is wideband and the data directly modulates the DCO frequency in a feed-forward manner such that it effectively removes the loop dynamics from the modulating transmit path. The rest of the loop, however, including all error sources, operates under the normal closed loop regime.

The z-domain transfer function from both feeds of the modulating data to the frequency deviation $\Delta f_V$ at the output of the PLL is $$H(z) = \left[1 + \frac{L(z)}{z-1}\right]\left[\frac{r \cdot f_R}{1 + r \cdot \frac{L(z)}{z-1}}\right] \quad (7)$$

where

L(z) is the loop filter transfer function;

$r = K_{DCO}/\hat{K}_{DCO}$

H(z) could be simplified to $$H(z) = r \cdot f_R \frac{z - [1 - L(z)]}{z - [1 - r \cdot L(z)]} \quad (8)$$

The PLL loop has a pole at $[1-r \cdot L(z)]$ and a zero at $[1-L(z)]$. The dc gain is always unity, when normalized to $f_R$, which could be readily seen by inspection: $H(z)|_{z=1} = f_R$. The high frequency gain is $H(z)|_{z=-1} \approx r \cdot f_R$, since $L(z) \ll 1$.

An approximate rule for $r = K_{DCO}/\hat{K}_{DCO} \approx 1$ can be stated as follows. Frequency components of the modulating data within the loop bandwidth are accurately represented at the RF output, whereas the frequency components higher than the loop bandwidth are slightly magnified if r>1 or attenuated if r<1. If the DCO gain is estimated accurately then the modulation bandwidth is all-pass from dc to half of the reference frequency $f_R$, with 26 MHz being the most commonly used $f_R$. In this fashion, the loop dynamics are removed from the modulation path, while the noise and error sources undergo normal closed loop attenuation. It could be shown that to meet, for example, GSM specifications with a loop bandwidth of 40 kHz and damping factor of $\zeta=1/\sqrt{2}$, the estimated DCO gain error should satisfy: $|r-1| \leq 7\%$, which can be achieved with the present invention.

Figure 3:
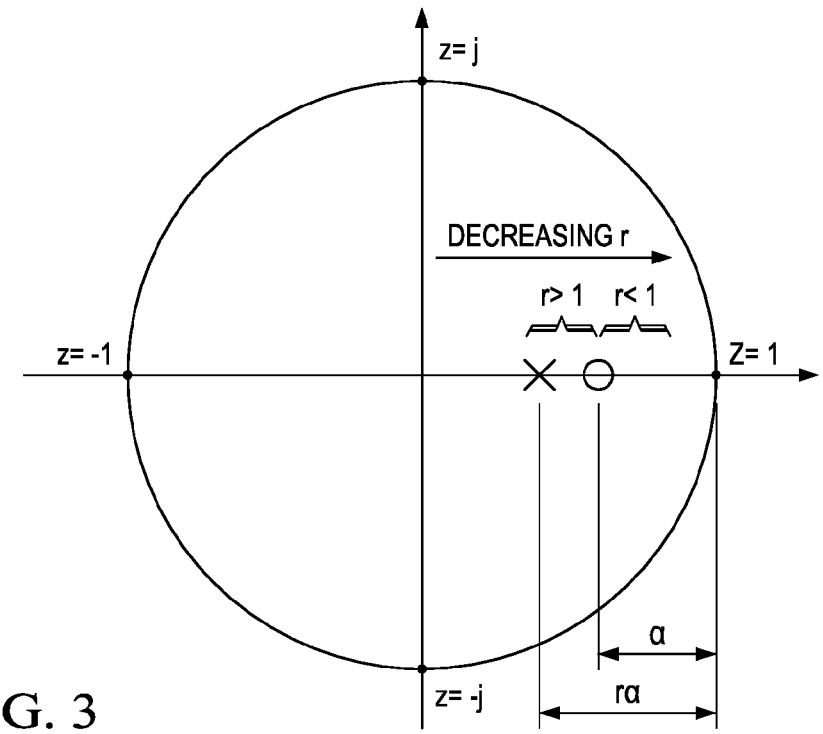
FIG. 3 is a diagram illustrating the complex plane location of the H(z) zero and pole movement with different values of DCO gain estimate accuracy r.

A diagram illustrating the complex plane location of the H(z) zero and pole movement with different values of DCO gain estimate accuracy r is shown in FIG. 3. The zero location is approximately the same (exactly the same for $\alpha=L(z)$ and $\rho=0$) as the PLL phase transfer function loop bandwidth $f_{BW}$ of the reference noise or of the modulating data without the feedforward y[k] entry. As shown in FIG. 3, the feedforward y[k] path could be viewed as placing a compensating zero in the vicinity of the pole. Note that the pole and zero coincide only when the DCO gain estimate is correct, and the direct frequency modulation of the PLL loop exhibits truly wideband all-pass transfer characteristics.

A DCO frequency change due to the $\Delta f_m$ modulating command step will instantly create $r \cdot \Delta f_m$ at the frequency detector variable input. Since the reference input of the frequency detector is $\Delta f_m$, the output of the frequency detector is $(1-r) \Delta f_m$. This value gets accumulated and, after filtering and scaling by $\alpha$, is input as the tuning word to the DCO oscillator. This negative feedback process iterates until the DCO frequency deviation $\Delta f_V$ settles to the desired frequency deviation $\Delta f_m$. The settled value of the loop filter contribution to the normalized tuning word (NTW) is:

$$\Delta NTW(\text{settle}) = -\frac{r-1}{r} \cdot \frac{\Delta f_m}{f_R} \quad (9)$$

The settled value of the phase error in type-1 configuration ($\rho=0$) is $$\Delta\phi_E(\text{settle}) = -\frac{r-1}{r} \cdot \frac{\Delta f_m}{f_R} \cdot \frac{1}{\alpha} \quad (10)$$

Figure 4A:
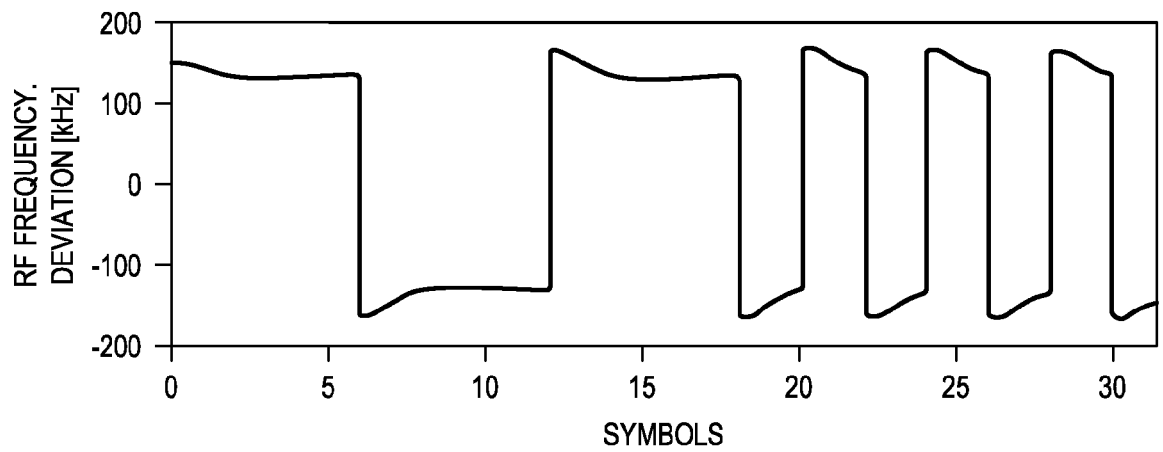
FIG. 4A is a graph of frequency deviation.

A graph of frequency deviation $\Delta f_{n1}$ versus number of symbols is shown in FIG. 4A. It should be noted that in general, the modulating data y[k] need not be rectangular and can exhibit more gradual transitions such as when output from a pulse-shaping filter. The rectangular shape is preferred here for illustration purposes. A graph of the non-filtered phase error $\phi_E$ and filtered phase error $\phi_F$, in the presence of +10% $K_{DCO}$ error is shown in FIG. 4B. When the integral term $\rho$ is nonzero, the additional pole at dc slowly forces the phase error $\phi_E$ to zero as shown in FIG. 4B in the region of the first 18 symbols. In this simulation, all phase noise sources are incorporated. These comprise the DCO, FREF and the TDC quantization noise sources. The peak deviation for the low band is $\Delta f_m = 2 \times 67.7$ kHz. In the region beyond the first 18 symbols, the modulating data transition interval is shortened to two symbols. The ADPLL loop bandwidth will not allow the phase error to fully settle for the data frequency of 270.833 kHz/4=67.7 kHz, so the peaks are now smaller than before.

A clearly defined trajectory of the filtered phase error $\phi_E$ is visible even for the very small $K_{DCO}$ error of +1%, as shown in FIGS. 5A and 5B.

The present invention provides a gain adaptation algorithm that is operative to estimate the DCO gain $K_{DCO}$ using a robust true gradient type mechanism. In accordance with the algorithm, the true stochastic gradient between the modulation data applied to the ADPLL and the phase error accumulated in the loop is calculated. The robustness of the gain calibration algorithm is further improved by the addition of a neural network derived momentum term which allows the algorithm to settle to a steady state solution with greater stability. In addition, infinite impulse response (IIR) filters in the modulation data and phase error paths allow for a trade-off between the accuracy and the sensitivity or stability of the algorithm independent of the operation of the ADPLL loop.

Figure 6:
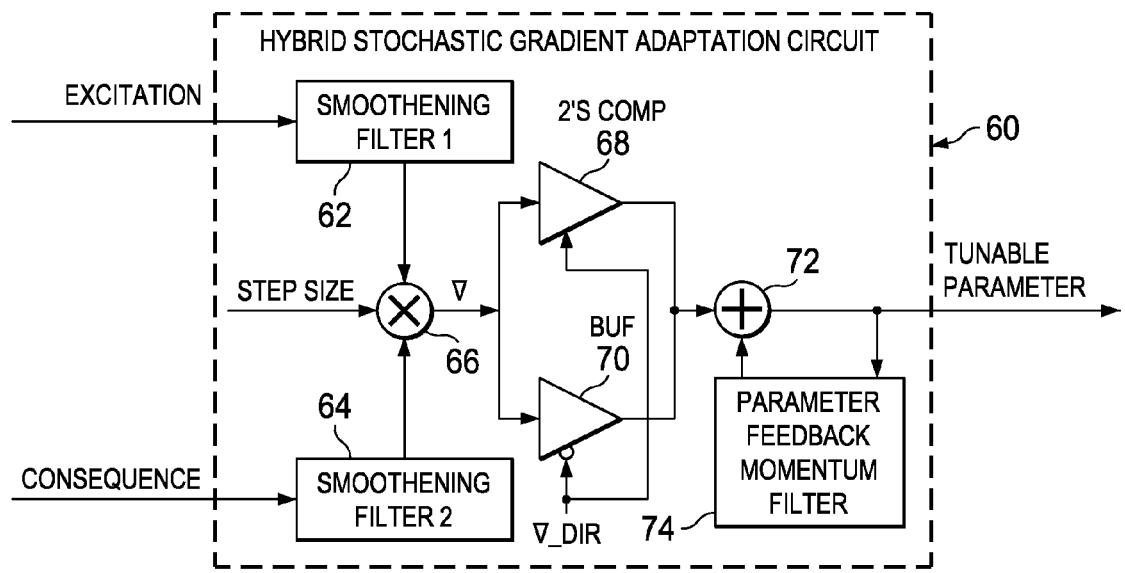
FIG. 6 is a block diagram illustrating a generalized embodiment of the hybrid stochastic gradient gain adaptation mechanism of the present invention.

A block diagram illustrating a generalized embodiment of the hybrid stochastic gradient gain adaptation mechanism of the present invention is shown in FIG. 6. The hybrid stochastic gradient adaptation circuit, generally referenced 60, is a generalized adaptation circuit that is applicable to systems where an excitation generates a consequence, both of which can be sampled and applied to the adaptation circuit. The circuit 60, comprises smoothing filters 62, 64, stochastic gradient calculation 66, negator 68, buffer 70, adder 72 and momentum filter 74.

In operation, the filters (e.g., IIR type filters) function to smooth the excitation and consequence input signals. The stochastic gradient (represented as $\nabla$) is calculated between the smoothed excitation signal and the smoothed consequence signal. The signal $\nabla\_DIR$ controls the direction of the gradient: '0' for positive (i.e. true stochastic gradient) and; '1' for negative (i.e. contra stochastic gradient). The direction control is applied, by passing the stochastic gradient through either two's (2's) complement generator 68 or buffer 70. The gradient direction is determined based on the parameters of the algorithm and the phase relationship between the filtered data FCW and phase error. The contra stochastic gradient (i.e. inverse of the gradient) is used (1) when the excitation is oscillatory in nature and has numerous zero crossings, e.g., sine or square wave; (2) there is a significant delay between the excitation and the consequence, and (3) at all instances where the consequence lags the excitation by more than half a period.

A momentum term generated by a parameter feedback momentum filter 74 is added via adder 72 to the stochastic gradient result and the sum is accumulated to yield the output tunable parameter. The momentum filter is derived from neural network theory and functions to stabilize the algorithm by adding inertia to the state of the algorithm. This results in tighter convergence as well as invulnerability against any large transient variations that may exist in the input data.

The smoothing filters applied to the excitation and consequence input signals serve several purposes. First, the filters function to reduce measurement noise and the effects of outlier excitation and consequence values. Second, the filters provide a delay alignment between the excitation and consequence signals due to the fact that the consequence signal is delayed as a result of the causal propagation delay of the system.

Third, if the observation delay between the consequence signal with respect to the excitation signal can be compensated by the relative group delay of the smoothing filers, then the gradient calculated as the product of the filtered excitation and consequence signals is positive. Note that this is also true if the excitation is periodic in nature and the consequence is aligned to $\pm nT$ wherein $n=0, 1, 2, \ldots$, T is the time period of excitation.

Fourth, if the consequence signal is collected from a system with a large temporal delay such that the relative group delay of the smoothing filters is inadequate to align the filtered excitation and consequence signals, but the two signals can be aligned with a 180 degree phase shift (or in general with $\pm(2n+1)*T/2$ wherein $n=0, 1, \ldots$), then the gradient will be negative and must be corrected by a negative sign (i.e. $\nabla\_DIR=1$). Note that this typically occurs when the propagation delay between the excitation and consequence is greater than the time period of the excitation waveform.

Figure 7:
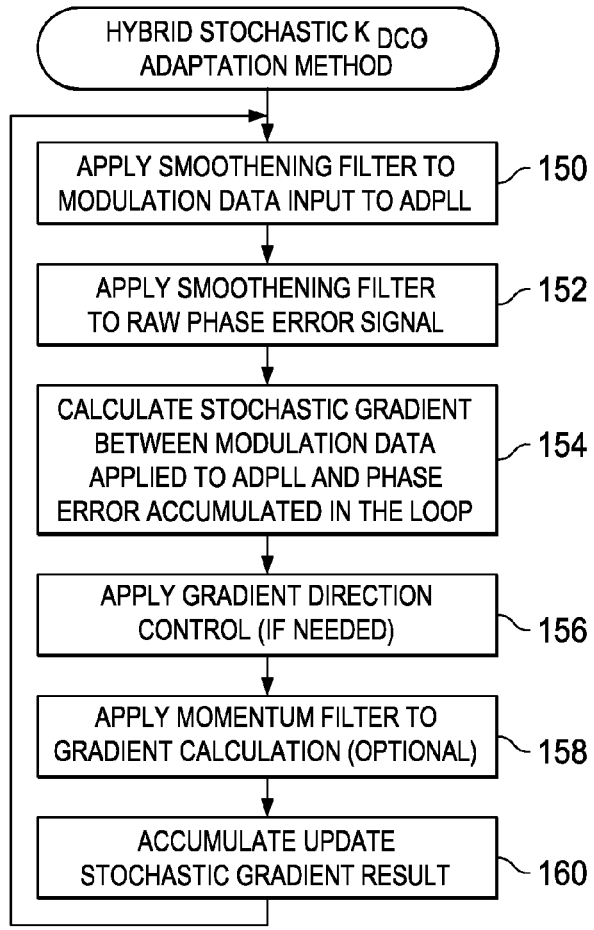
FIG. 7 is a flowchart illustrating the RF digitally controlled oscillator (DCO) hybrid stochastic gradient based gain calibration method of the present invention.

A flowchart illustrating the RF digitally controlled oscillator (DCO) gain calibration method of the present invention in more detail is shown in FIG. 7. The following algorithm may be implemented in software, hardware or a combination of both software and hardware depending on the particular implementation. The algorithm is based on an iterative stochastic gradient algorithm which is a well-known mathematical technique and is not described in detail herein. First, a smoothing filter (e.g., IIR) is applied to the modulation data (step 150) and the raw phase error signal (step 152). The stochastic gradient is computed between the filtered modulation data and the filtered phase error (step 154). Gradient direction control is then applied to the result (step 156). The inverse (i.e. contra stochastic gradient) or the non-inverse is selected based on the parameters of the algorithm and the phase relationship between the filtered data FCW and phase error. Note that this step is not necessary for $K_{DCO}$ calibration in an ADPLL as described in more detail infra.

A momentum term is then calculated based on a plurality of previous values of the gradient (step 158). The momentum term is added to the current gradient and the updated gradient is accumulated over time to yield the updated output $K_{DCO}$ value (step 160).

Figure 8:
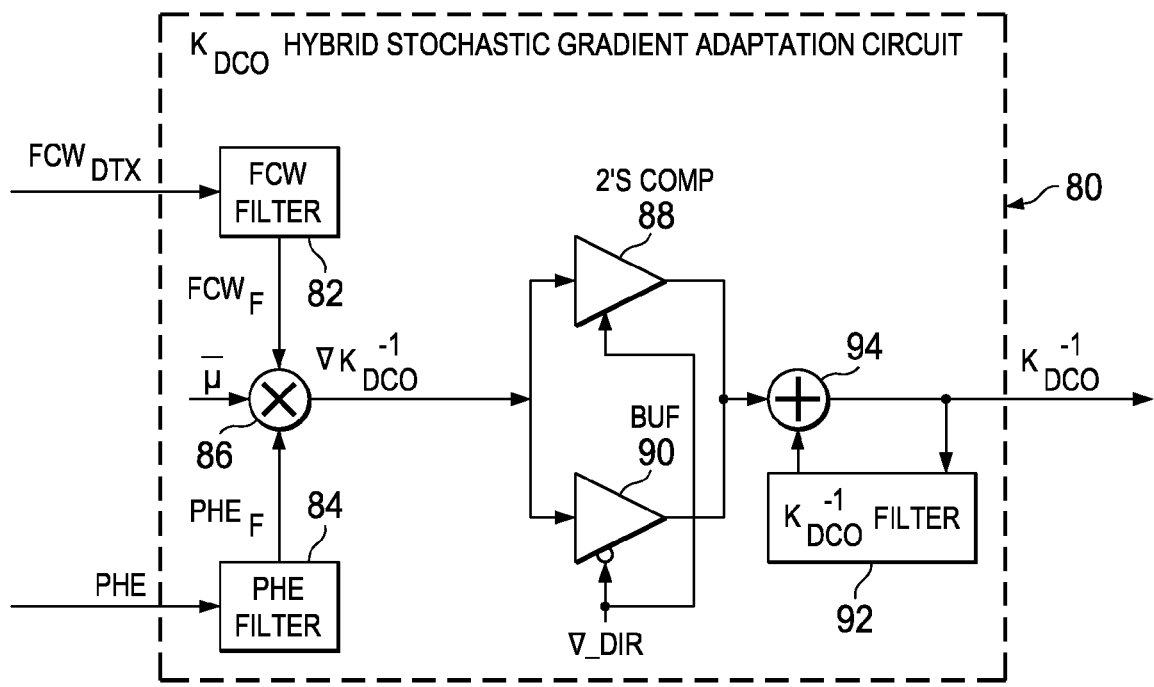
FIG. 8 is a block diagram illustrating a first example embodiment of the RF DCO hybrid stochastic gradient gain adaptation mechanism of the present invention.

A block diagram illustrating a first example embodiment of the RF DCO hybrid stochastic gradient gain adaptation mechanism of the present invention is shown in FIG. 8. The hybrid stochastic gradient $K_{DCO}$ adaptation circuit of the ADPLL, generally referenced 80, comprises FCW smoothing filter 82, phase error smoothing filter 84, stochastic gradient calculator 86, gradient negator 88, buffer 90, adder 94 and momentum filter ($K_{DCO}^{-1}$ filter) 92.

In operation, the FCW filter functions to filter the modulation data FCW to generate the $FCW_F$ signal. Similarly, the PHE filter functions to filter the raw phase error signal to generate the $PHE_F$ signal. The stochastic gradient (represented by $\nabla K_{DCO}^{-1}$) between the filtered FCW signal and the corresponding filtered phase error signal is then calculated. The input $\hat{\mu}$ determines the step size used (i.e. the learning rate) by the gradient calculator. The signal $\nabla\_DIR$ controls the direction of the gradient: '0' for positive (i.e. true stochastic gradient) and '1' for negative (i.e. contra stochastic gradient). The direction control is applied by passing the stochastic gradient through either 2-s compliment generator 88 or buffer 90.

The momentum term generated by the $K_{DCO}^{-1}$ filter 92 is added via adder 94 to the stochastic gradient result and the sum is accumulated to yield the updated $K_{DCO}^{-1}$ output. The momentum filter functions to stabilize the operation of the circuit by adding inertia to the state of the circuit against any large transient variations that may exist in the input data thus providing tighter convergence. For $K_{DCO}$ adaptations the circuit calculates the stochastic gradient between time-varying calibration or actual modulation data and the raw phase error accumulated in the ADPLL. The two filters 82, 84, may comprise first order IIR filters, function to preprocess the observable data to limit the bandwidth of the computed stochastic gradient permitting a trade-off between sensitivity on the one hand and settling time on the other. The filters can also be used to delay equalize the observable data before gradient computation.

The updated gradient is added to the current value of the DCO gain multiplier via an accumulator (within the filter). The output of the accumulator comprises the estimate of the DCO gain multiplier and is used to scale the tuning word before it is input to the DCO. Note that the gain calibration circuit has the advantage of being insensitive to the RF oscillator frequency drift.

Figure 9:
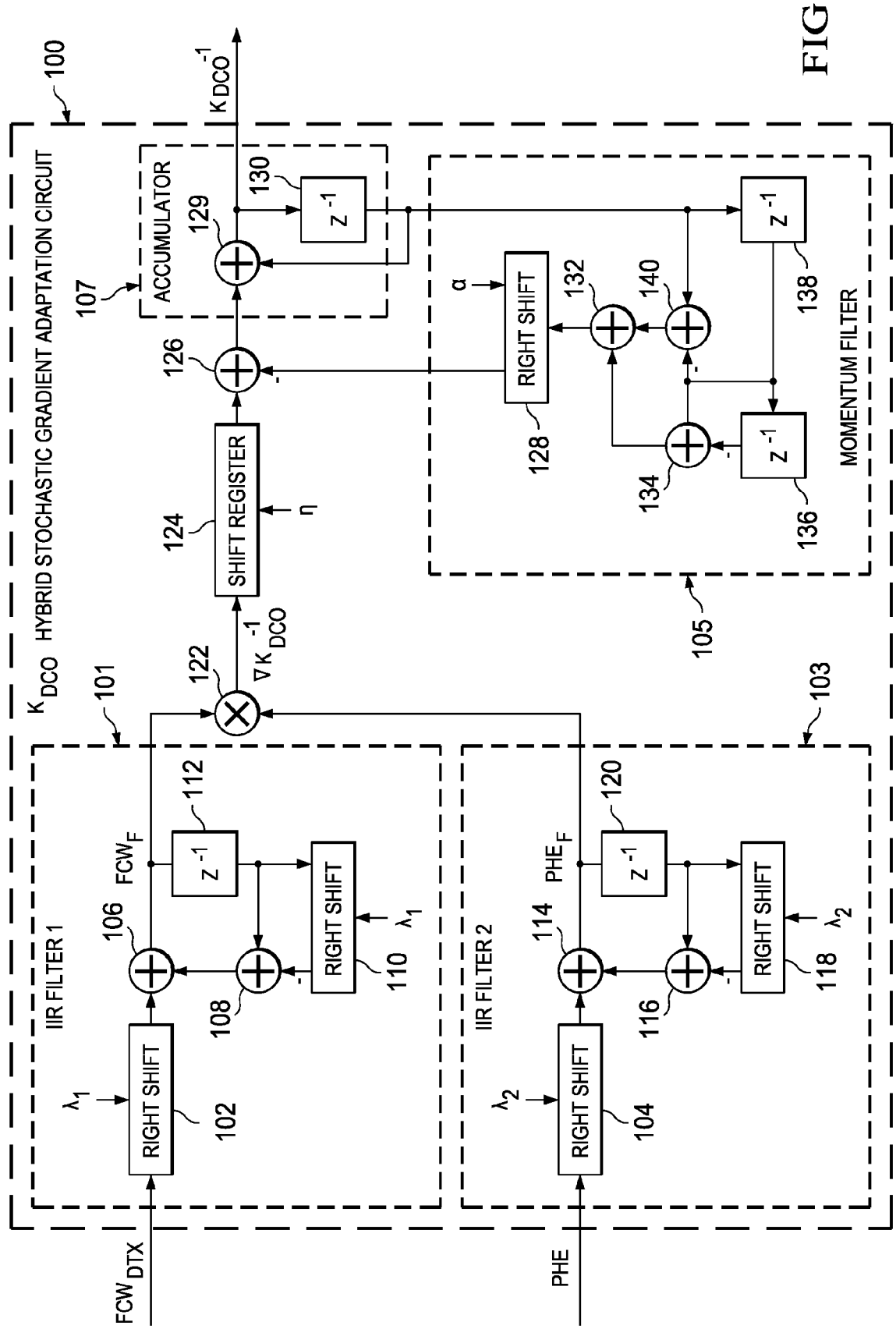
FIG. 9 is a block diagram illustrating a second example embodiment of the RF DCO hybrid stochastic gradient gain adaptation mechanism of the present invention; {Drawing has many mistakes: FCW_DTX appears twice; let us avoid using dotted lines (instead of solid) for the momentum generator signals.}

A block diagram illustrating a second example embodiment of the RF DCO hybrid stochastic gradient gain adaptation mechanism of the present invention is shown in FIG. 9. The $K_{DCO}$ hybrid stochastic gradient adaptation circuit, generally referenced 100, comprises filters 101, 103, stochastic gradient calculator 122, shift register 124, adder 126, momentum filter 105 and accumulator 107.

Filter 1 (e.g. FCW filter), comprising right shift 102, 110 (wherein $\lambda_1$ determines the amount of right shift), adders 106, 108 and unit delay 112, is a first order IIR filter and functions to smooth the FCW input data. Similarly, filter 2 (e.g., PHE filter), comprising right shift 104, 118 (wherein $\lambda_2$ determines the amount of right shift), adders 114, 116 and unit delay 120, is a first order IIR filter and functions to smooth the phase error input PHE.

The stochastic gradient calculator 122 functions to generate the stochastic gradient from the smoothed/filtered FCW ($FCW_F$) and smoothed/filtered PHE ($PHE_F$). The gradient is input to a shift register to apply a learning rate defined as $2^n$. The output of the shift register is added with a momentum term generated by the momentum filter 105 which comprises right shift 128 (wherein $\alpha$ determines the amount of right shift), adders 132, 140, 134 and unit delays 136, 138. The resulting sum is input to an accumulator 107 comprising adder 129 and delay 130 to yield the updated $K_{DCO}^{-1}$ value.

The gradient components are filtered as follows $$FCW_F[n]=(1-2^{-\lambda_1})\cdot FCW_F[n-1]+2^{-80\,1}\cdot FCW_{DTX} \quad (11)$$

$$PHE_F[n]=(1-2^{\lambda_2})\cdot PHE_F[n-1]+2^{-\lambda_2}\cdot PHE_{DTX} \quad (12)$$

The stochastic gradient function is calculated as $$\nabla K_{DCO}^{-1}[n]=FCW_F[n]\cdot PHE_F[n] \quad (13)$$

Defining the scaled learning rate to be $2^\eta$, where $\eta$ is given by $$\eta=\log_2(2^{-\mu}\cdot f_R) \quad (14)$$

where $f_R$ is the reference frequency and $\mu$ in the un-scaled learning rate.

The momentum term is represented as $\Delta K_{DCO}^{-1}$ and its simplest implementation is given by $$\Delta K_{DCO}^{-1}[n]=(K_{DCO}^{-1}[n-1]-K_{DCO}^{-1}[n-2])+ (K_{DCO}^{-1}[n-2]-K_{DCO}^{-1}[n-3]) \quad (15)$$

Note that the above term comprises of the sum of the $K_{DCO}^{-1}$ updates computed at time instances n−1 and n−2 respectively.

The update law of the algorithm is therefore given by $$K_{DCO}^{-1}[n]=K_{DCO}^{-1}[n-1]+2^\eta\cdot\nabla K_{DCO}^{-1}[n]-2^{-\alpha}\Delta K_{DCO}^{-1}[n] \quad (16)$$

It is noted that this embodiment of the adaptation circuit does not include the direction of the previous embodiments. In this embodiment, the positive gradient is always chosen for the following reason. For $K_{DCO}$ calibration and compensation in the context of an ADPLL, the propagation delay between the modulating excitation (i.e. direct point frequency control word injection) and the consequence (i.e. phase error accumulation) is relatively small (i.e. approximately less than one reference frequency cycle). This delay can be easily compensated for by the differential group delay of the first order IIR filters used as smoothing filters in the adaptation algorithm. Thus, the calculated gradient is always positive and V_DIR control is not required.

Figure 10A:
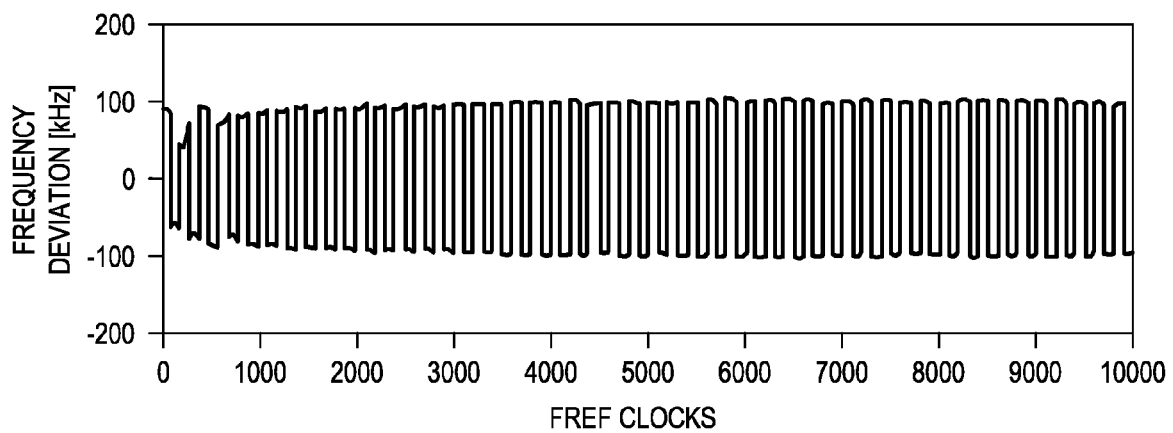
FIGS. 10A, 10B, 10C and 10D are graphs illustrating the frequency deviation, phase error, edge gradient and $K_{DCO}$ adaptation convergence for a square wave.
Figure 10B:
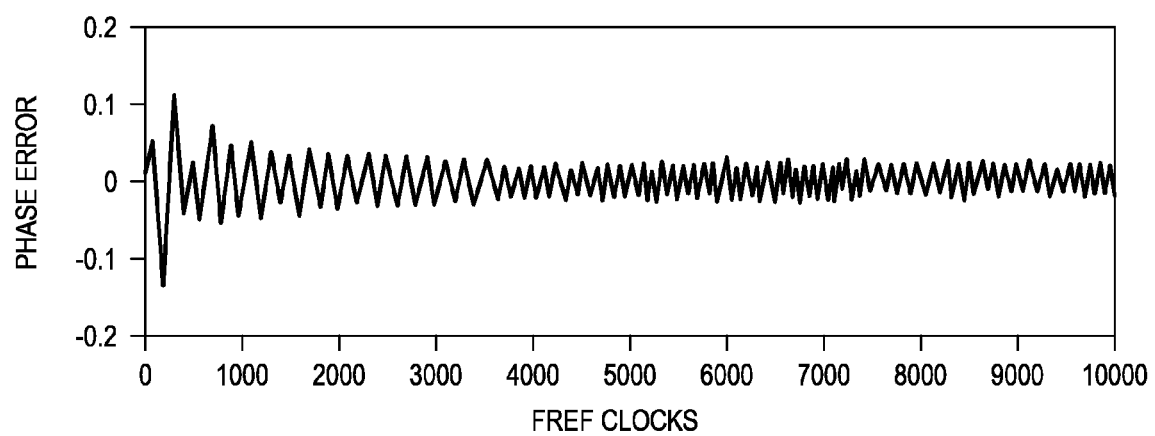
Figure 10C:
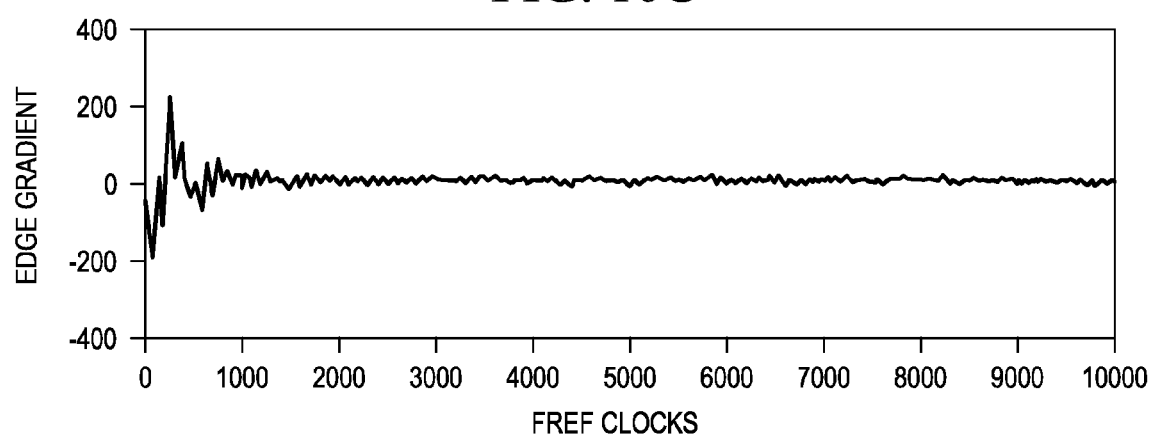
Figure 10D:
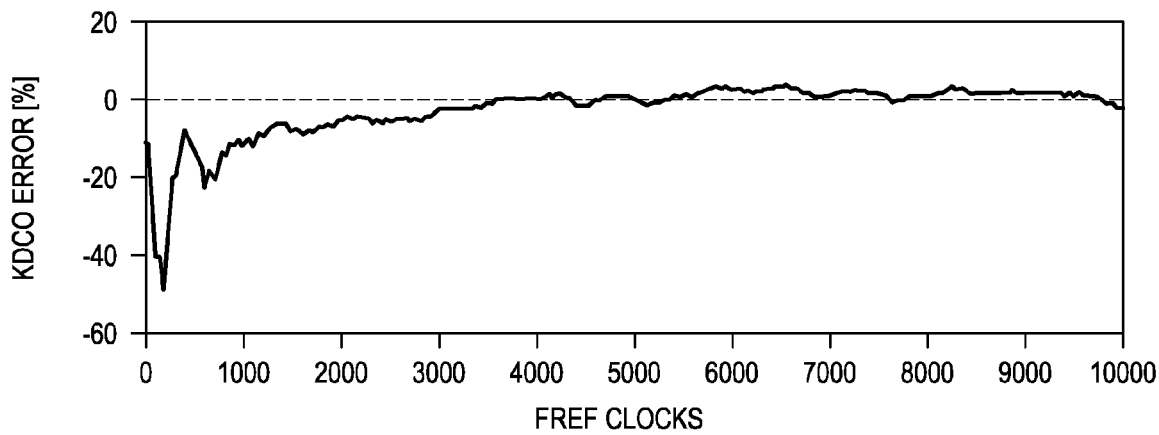

Simulation results of the $K_{DCO}$ gain adaptation algorithm of the present invention for various modulation schemes are presented below. Graphs illustrating the frequency deviation, phase error, edge gradient and $K_{DCO}$ error convergence for a square wave are shown in FIGS. 10A, 10B, 10C and 10D. In particular, FIG. 10A shows the frequency deviation of the signal, FIG. 10B shows the phase error, FIG. 10C shows the edge gradient and FIG. 10D shows the DCO gain $K_{DCO}$ error convergence over a plurality of symbols for an initial $K_{DCO}$ error of +10%. The adaptation parameters used in this simulation are as follows: $\lambda_1=2^{-7}$, $\lambda_2=2^{-9}$, $\mu=2^6=\alpha=0$. $f_R=26e6$, and $K_{DCO}=40e3$. Note that the $K_{DCO}$ error settles to within 1% error within approximately 3500 clock cycles.

Figure 11A:
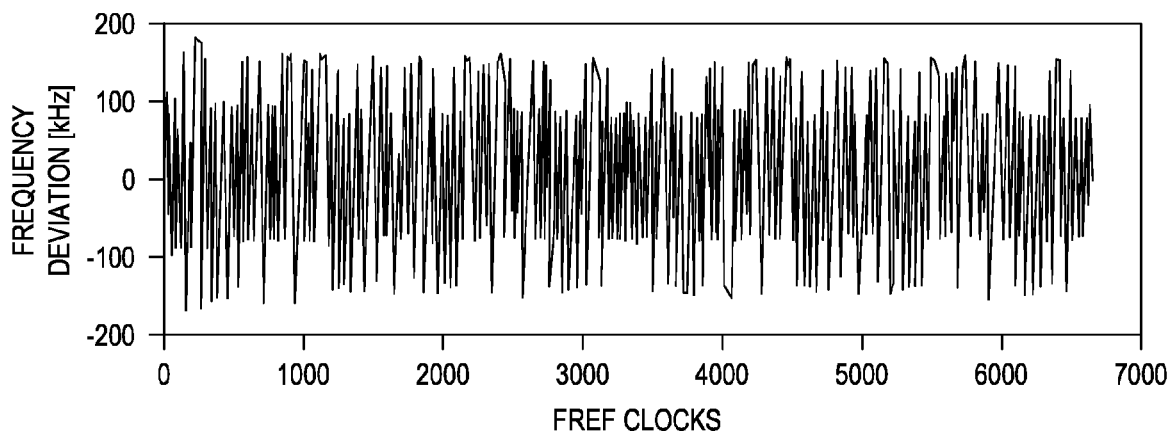
FIGS. 11A, 11B, 11C and 11D are graphs illustrating the frequency deviation, phase error, edge gradient and $K_{DCO}$ adaptation convergence for a Bluetooth signal.
Figure 11B:
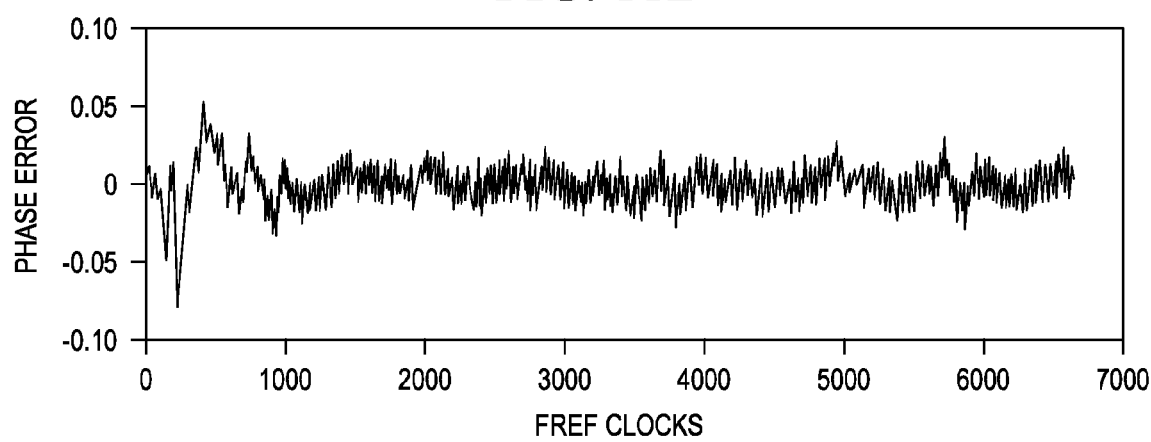
Figure 11C:
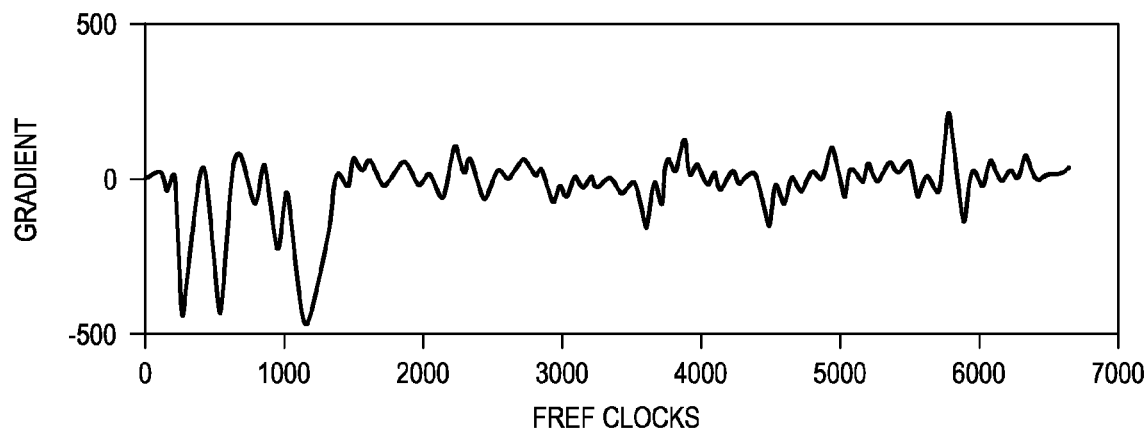
Figure 11D:
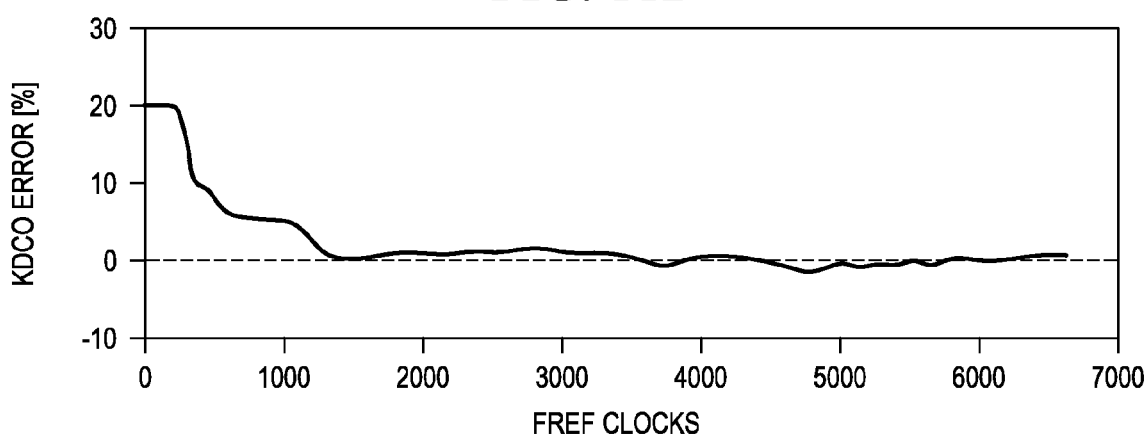

Graphs illustrating the frequency deviation, phase error, edge gradient and $K_{DCO}$ error convergence for a Bluetooth signal are shown in FIGS. 11A, 11B, 11C and 11D. In particular, FIG. 11A shows the frequency deviation of the signal, FIG. 11B shows the phase error, FIG. 11C shows the edge gradient and FIG. 11D shows the DCO gain $K_{DCO}$ error convergence over a plurality of symbols for an initial $K_{DCO}$ error of +20%. The adaptation parameters used in this simulation are as follows: $\lambda_1=2^{-8}$, $\lambda_2=-7$, $\mu=2^{-9}$ for 500 FREF clocks and $\mu=2^{-11}$ for tracking, $\alpha=0$, $f_R=13e6$, and $K_{DCO}=15e3$. Note that the $K_{DCO}$ error settles to within 1% error within approximately 1300 clock cycles.

Figure 12A:
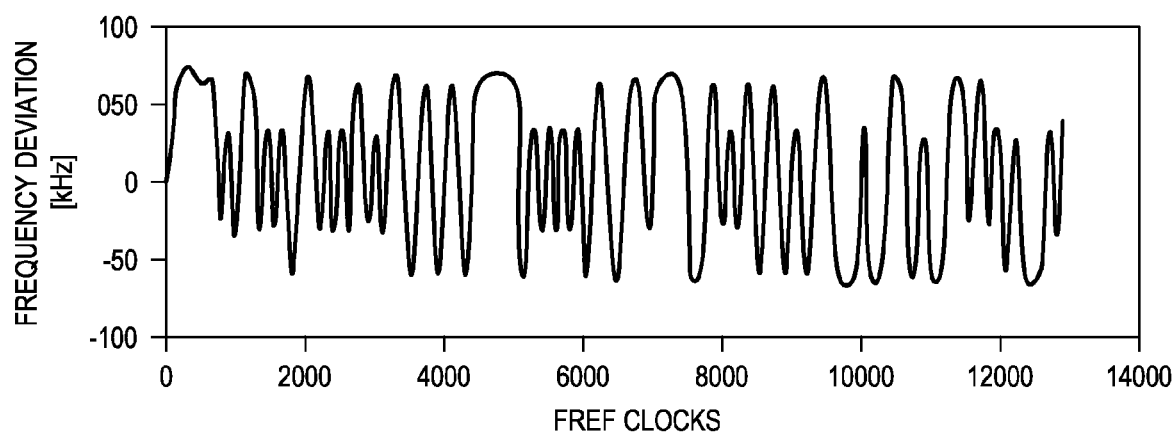
FIGS. 12A, 12B, 12C and 12D are graphs illustrating the frequency deviation, phase error, edge gradient and $K_{DCO}$ a adaptation convergence for a GSM signal.
Figure 12B:
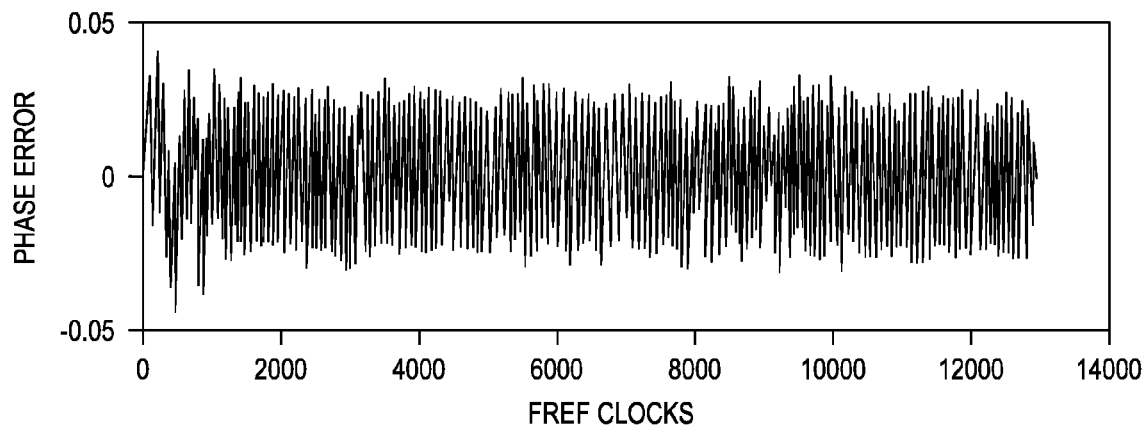
Figure 12C:
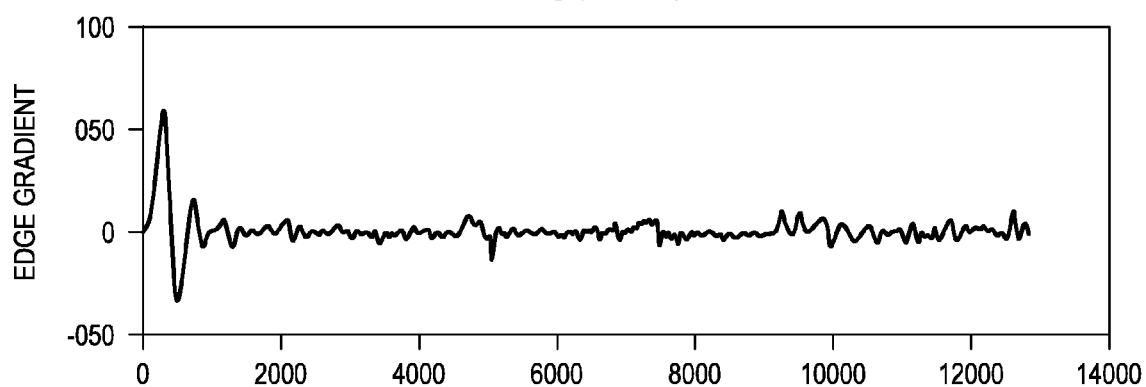
Figure 12D:
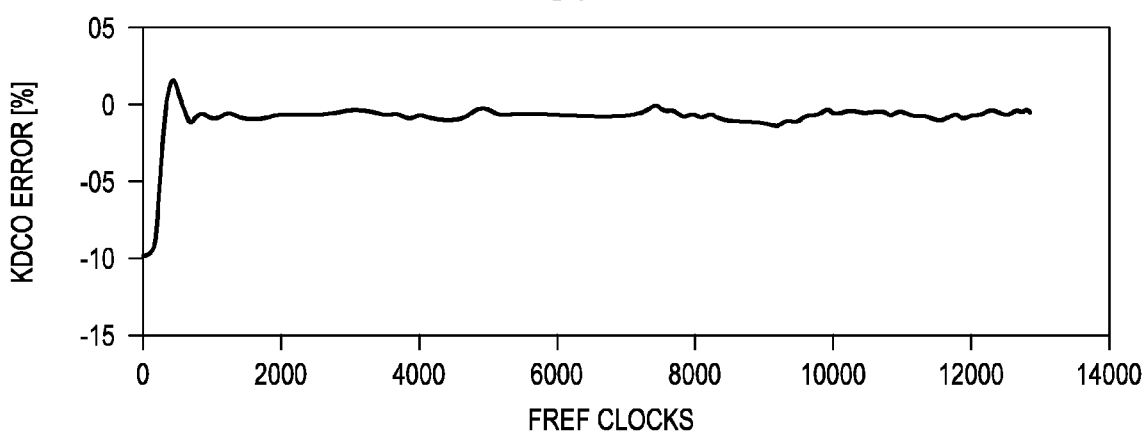

Graphs illustrating the frequency deviation, phase error, edge gradient and $K_{DCO}$ error convergence for a GSM signal are shown in FIGS. 12A, 12B, 12C and 12D. In particular, FIG. 12A shows the frequency deviation of the signal, FIG. 12B shows the phase error, FIG. 12C shows the edge gradient and FIG. 12D shows the DCO gain $K_{DCO}$ error convergence over a plurality of symbols for an initial $K_{DCO}$ error of −10%. The adaptation parameters used in this simulation are as follows: $\lambda_1=2^{-7}$, $\lambda_2=2^{-11}$, $\mu=2^{-6}$ for 500 FREF clocks and $\mu=2^{-7}$ for tracking, $\alpha=0$, $f_R=26e6$, and $K_{DCO}=15e3$. Note that the $K_{DCO}$ error settles within approximately 300 clock cycles.

Figure 13A:
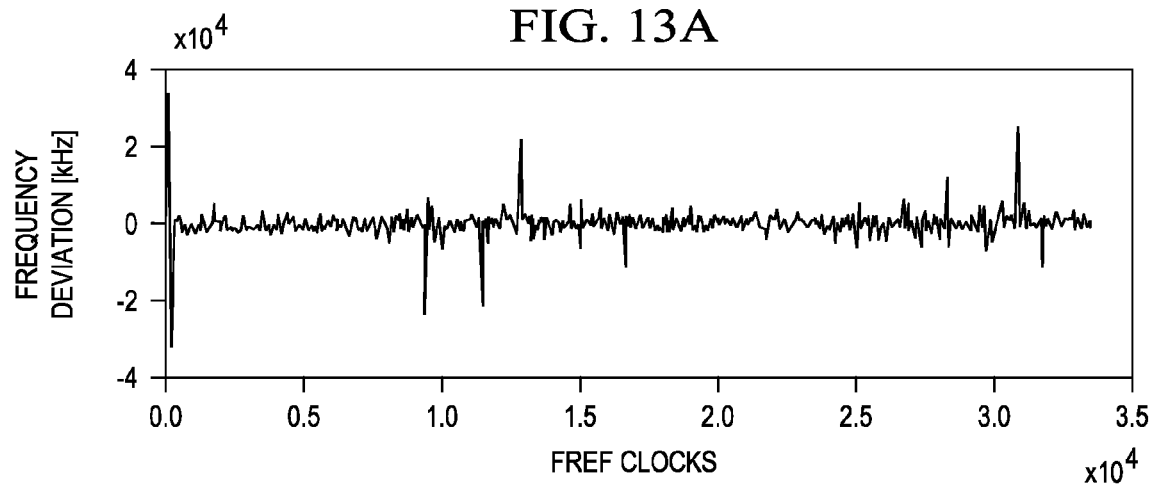
FIGS. 13A, 13B, 13C and 13D are graphs illustrating the frequency deviation, phase error, edge gradient and $K_{DCO}$ adaptation convergence for a WCDMA signal.
Figure 13B:
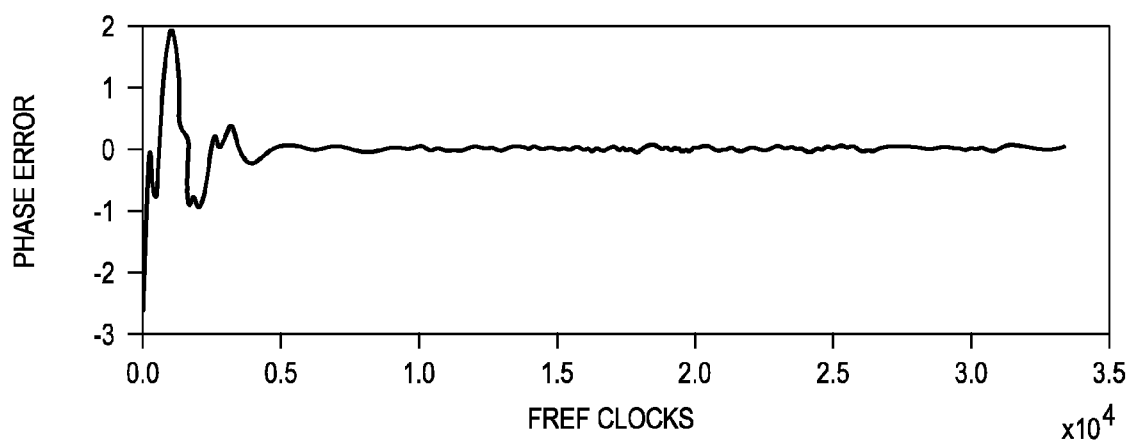
Figure 13C:
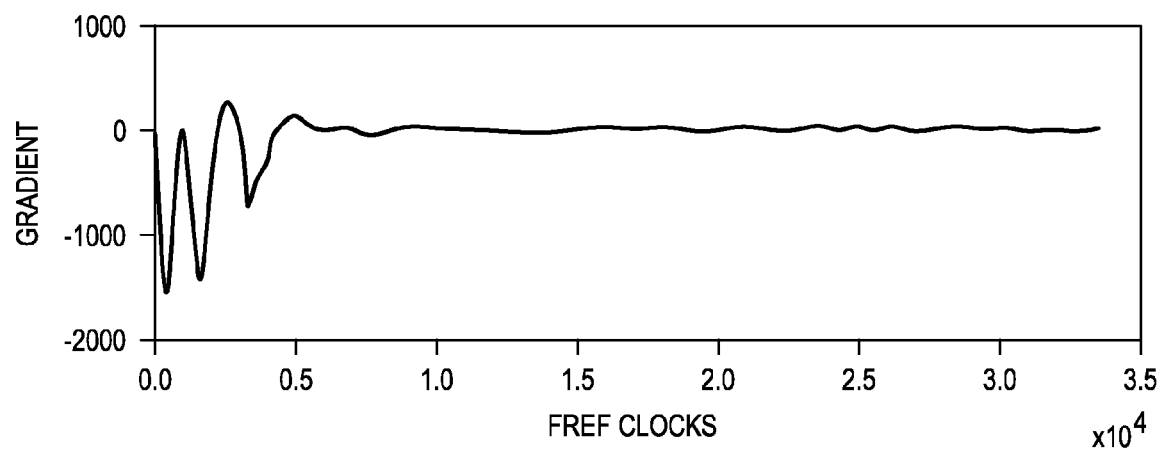
Figure 13D:
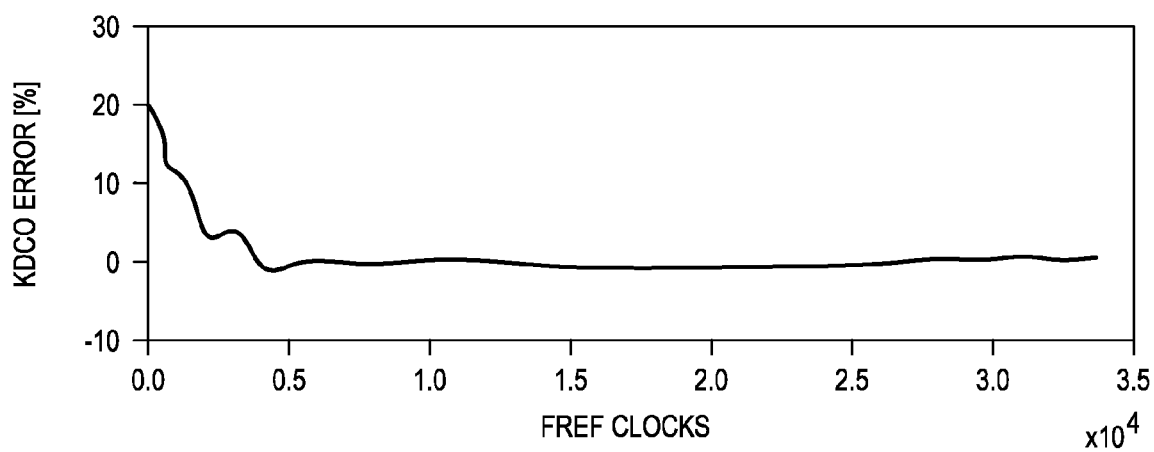

Graphs illustrating the frequency deviation, phase error, edge gradient and $K_{DCO}$ error convergence for a WCDMA signal are shown in FIGS. 13A, 13B, 13C and 13D. In particular, FIG. 13A shows the frequency deviation of the signal. FIG. 13B shows the phase error, FIG. 13C shows the edge gradient and FIG. 13D shows the DCO gain $K_{DCO}$ error convergence over a plurality of symbols for an initial $K_{DCO}$ error of +20%. The adaptation parameters used in this simulation are as follows: $\lambda_1=2^{-11}$, $\lambda_2=2^{-16}$, $\mu=2^{-14}$ for 500 FREF clocks and $\mu=2^{-15}$ for tracking, $\alpha=0$, $f_R=26e6$, and $K_{DCO}=100e3$. Note that the $K_{DCO}$ error settles to 1% error within approximately 5000 clock cycles.

Figure 14A:
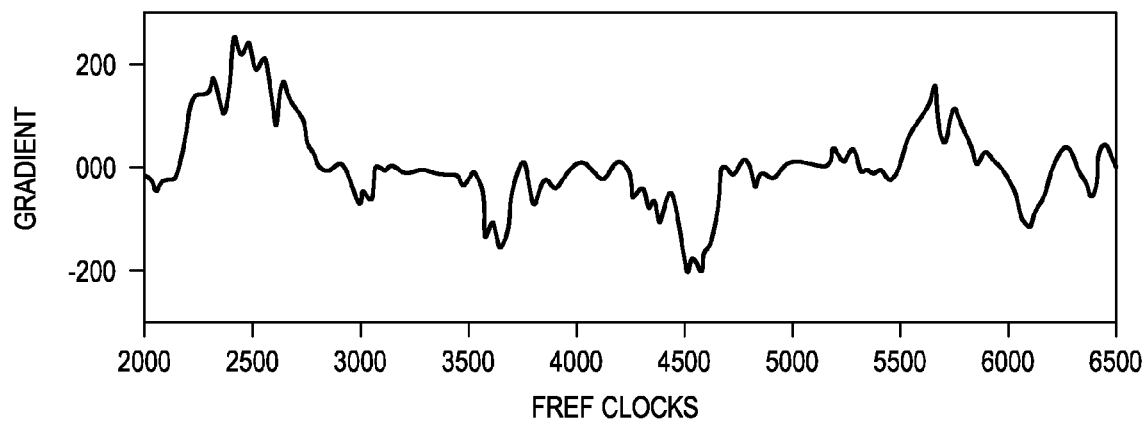
FIGS. 14A, 14B, 14C, 14D, 14E, and 14F are graphs illustrating the effect of the optional momentum term in generating the updated DCO gain $K_{DCO}$ when used for example with Enhanced Data Rate (EDR) Bluetooth modulation.
Figure 14B:
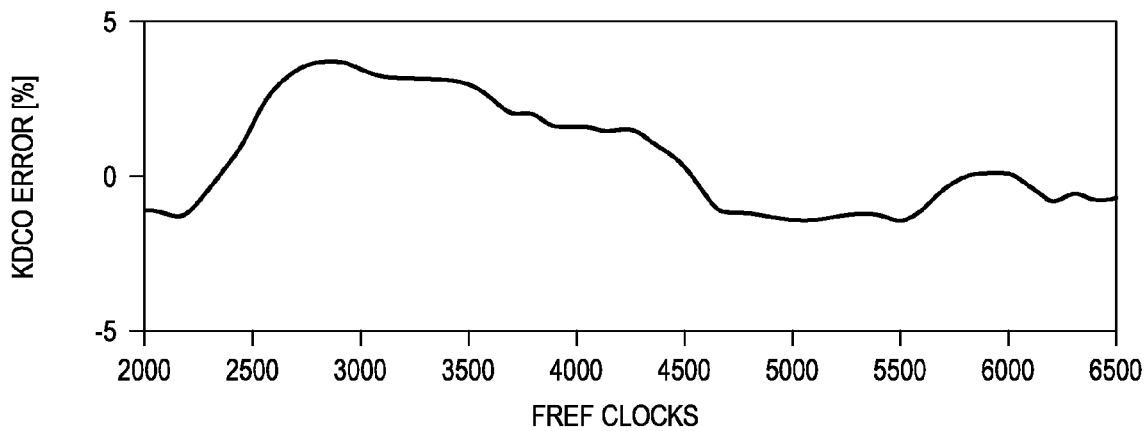
Figure 14C:
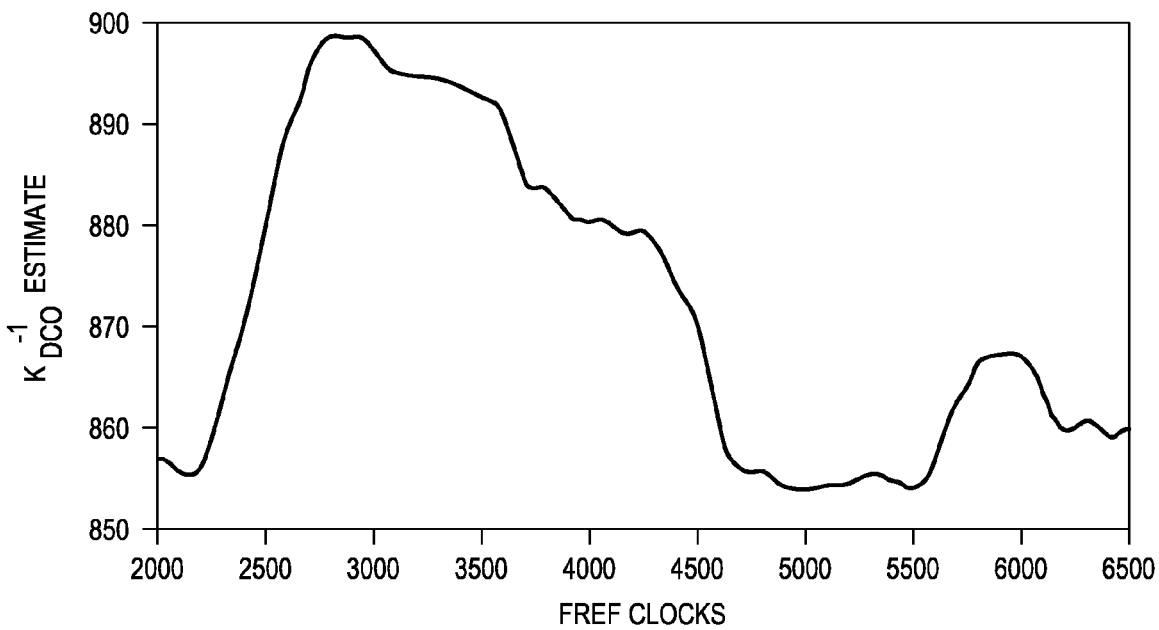
Figure 14D:
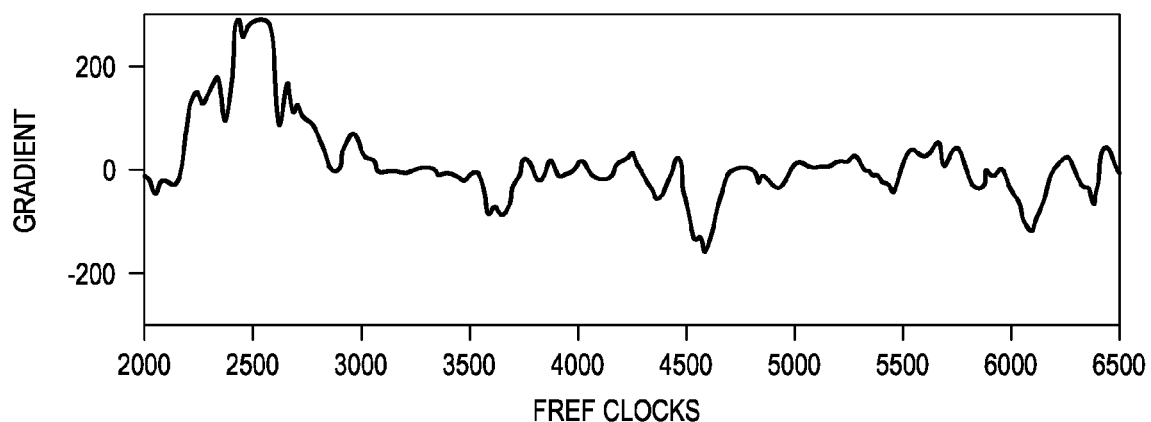
Figure 14E:
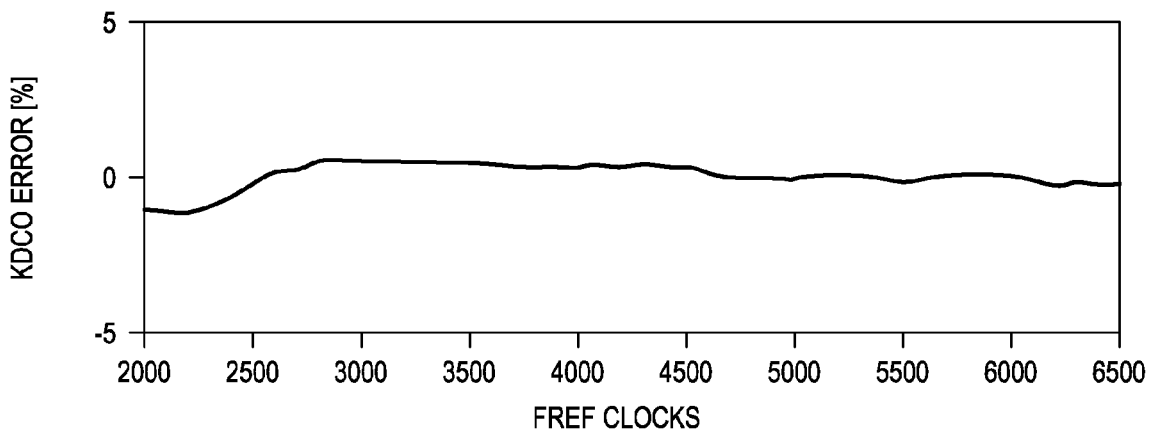
Figure 14F:
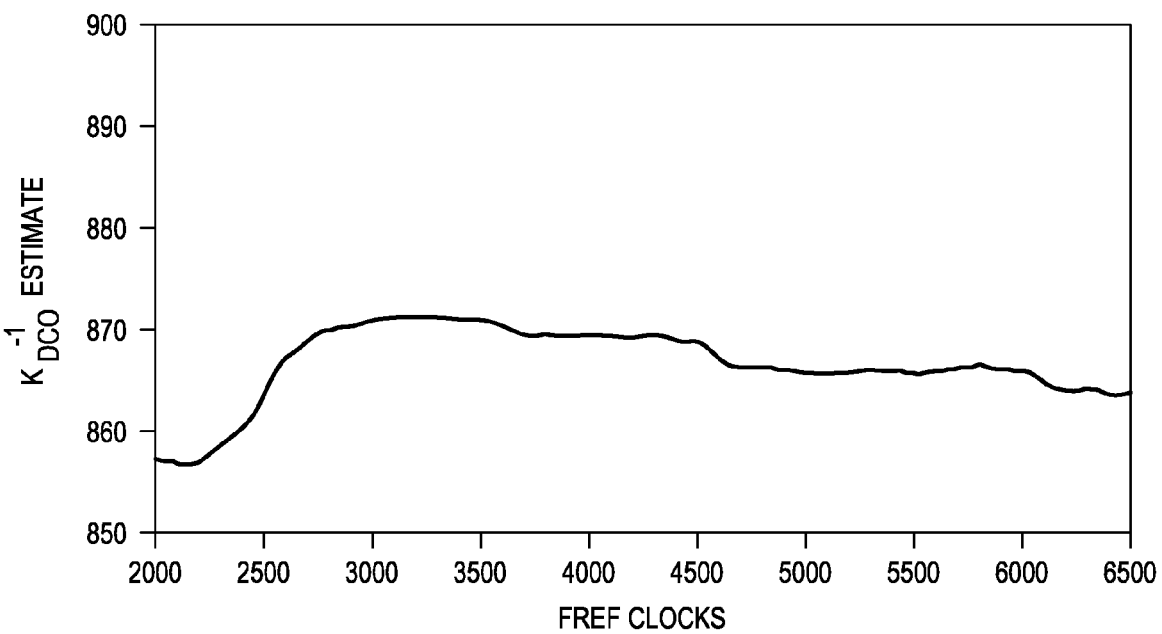

As described supra, the invention is operative to incorporate a momentum in the adaptation algorithm which functions to better stabilize the algorithm by adding inertia to the variables thus protecting against large transient swings in the input data. Graphs illustrating the effect of the optional momentum term in generating the updated DCO gain $K_{DCO}$ are shown for a Bluetooth signal in FIGS. 14A, 14B, 14C, 14D, 14E and 14F. FIGS. 14A, 14B and 14C show the gradient, $K_{DCO}$ error and $K_{DCO}^{-1}$ estimate results for a Bluetooth signal without the momentum term. FIGS. 14D, 14E and 14F show the gradient, $K_{DCO}$ error and $K_{DCO}^{-1}$ estimate results for a Bluetooth signal with the momentum term. As can be seen in FIG. 14E, incorporating the momentum term in the algorithm provides a significant decrease in $K_{DCO}$ error.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. An adaptation method comprising the steps of:
    calculating a stochastic gradient as a function of an excitation signal and a consequence signal;
    generating a momentum feedback signal from said stochastic gradient and combining said momentum feedback signal with said stochastic gradient to yield a new output parameter therefrom; and
    adding said new output parameter to a current output parameter to generate an updated output parameter therefrom.

2. The method according to claim 1, further comprising scaling of said stochastic gradient, said scaling is used to control rate of said adaptation.

3. The method according to claim 1 further comprising scaling of said momentum feedback signal, said scaling of said momentum feedback signal is used to control inertia of said adaptation.

4. The method according to claim 2, wherein said scaling of said stochastic gradient is varied over time to achieve better adaptation convergence behavior.

5. The method according to claim 2, wherein said scaling of said stochastic gradient is varied over time to minimize residual adaptation error.

6. The method according to claim 1, further comprising the step of filtering of said excitation signal, said filtering step generating filtered excitation signal.

7. The method according to claim 1 further comprising the step of filtering of said consequence signal, said filtering step generating filtered consequence signal.

8. The method according to claim 1 further comprising the step of filtering of said excitation signal and said consequence signal, said filtering step generating filtered excitation and consequence signals.

9. The method according to claim 2, wherein a positive value of said stochastic gradient scaling factor is used for positive time correlation between said excitation and consequence signals.

10. The method according to claim 1, wherein said stochastic gradient may be calculated on stored values of said excitation and consequence signals.

11. A method of gain calibration of a digitally controlled oscillator (DCO), said method comprising the steps of:
    calculating a stochastic gradient as a function of a frequency command word (FCW) signal and a consequence signal derived from a set of a phase error and frequency error; and
    adding said stochastic gradient to a current value of a DCO gain multiplier to generate an updated DCO gain multiplier.

12. The method according to claim 11, further comprising the step of filtering said FCW signal to produce a filtered FCW signal.

13. The method according to claim 11, further comprising the step of filtering said consequence signal to produce a filtered consequence signal.

14. The method according to claim 13, further comprising the step of generating a momentum feedback signal from said stochastic gradient and adding scaled value of said momentum feedback signal to said stochastic gradient.

15. The method according to claim 13, further comprising the step of scaling of said stochastic gradient, said scaling is operative to control adaptation rate of said gain calibration.

16. The method according to claim 14, wherein said step of adding comprises accumulating said DCO gain multiplier.

17. An apparatus for gain calibration of a digitally controlled oscillator (DCO) comprising:
    means for calculating a stochastic gradient as a function of a frequency command word (FCW) signal and a phase error signal;
    means for generating a momentum feedback signal in response to said stochastic gradient and adding said momentum feedback signal to said stochastic gradient output to yield a modified stochastic gradient therefrom; and
    means for adding said modified stochastic gradient to a current value of a DCO gain multiplier value to yield an updated DCO gain multiplier therefrom.

18. The apparatus according to claim 17, further comprising the means for filtering said FCW signal.

19. The apparatus according to claim 17, further comprising the means for filtering said phase error signal.

20. A transmitter comprising:
    a frequency synthesizer for performing a frequency modulation; said frequency synthesizer comprising a digitally controlled oscillator (DCO);
    a gain calibration circuit of said digitally controlled oscillator, said gain calibration circuit comprising:
    means for calculating a stochastic gradient as a function of an input data frequency command word (FCW) and the phase (or frequency) error signals;
    means for generating a momentum feedback signal in response to said stochastic gradient values, scaling it and adding said scaled momentum feedback signal to said stochastic gradient output to yield a modified stochastic gradient therefrom; and
    means for scaling and adding said scaled modified stochastic gradient to a current value of a DCO gain multiplier value to yield an updated DCO gain multiplier therefrom.

* * * * *